(12) United States Patent
Inoue et al.

(10) Patent No.: US 7,212,083 B2
(45) Date of Patent: May 1, 2007

(54) FILTER DEVICE UTILIZING STACKED RESONATORS AND ACOUSTIC COUPLING AND BRANCHING FILTER USING SAME

(75) Inventors: Kenji Inoue, Tokyo (JP); Hisatoshi Saitou, Tokyo (JP)

(73) Assignee: TDK Corporation, Tokyo (JP)

( * ) Notice: Subject to any disclaimer, the term of this patent is extended or adjusted under 35 U.S.C. 154(b) by 160 days.

(21) Appl. No.: 10/902,525

(22) Filed: Jul. 30, 2004

(65) Prior Publication Data

US 2005/0030126 A1 Feb. 10, 2005

(30) Foreign Application Priority Data

Aug. 4, 2003 (JP) ............... 2003-205703

(51) Int. Cl.
*H03H 9/54* (2006.01)
*H03H 9/70* (2006.01)

(52) U.S. Cl. .................. 333/189; 333/133

(58) Field of Classification Search ........... 333/187, 333/189, 193, 195, 133
See application file for complete search history.

(56) References Cited

U.S. PATENT DOCUMENTS

| | | | | |
|---|---|---|---|---|
| 1,959,429 A | * | 5/1934 | Hovgaard | 333/189 |
| 3,568,108 A | * | 3/1971 | Poirier et al. | 333/187 |
| 5,486,800 A | * | 1/1996 | Davenport | 333/193 |
| 5,682,126 A | * | 10/1997 | Plesski et al. | 333/193 |
| 5,910,756 A | * | 6/1999 | Ella | 333/133 |
| 6,448,695 B2 | * | 9/2002 | Milsom | 310/334 |
| 2005/0012570 A1 | * | 1/2005 | Korden et al. | 333/189 |

FOREIGN PATENT DOCUMENTS

| JP | 10-93375 | | 4/1998 |
|---|---|---|---|
| JP | 2002-217676 | * | 8/2002 |

* cited by examiner

*Primary Examiner*—Barbara Summons
(74) *Attorney, Agent, or Firm*—McGinn IP Law Group, PLLC

(57) ABSTRACT

A filter device is provided which is low in power loss, small in size and operates in wide bands. The filter device includes a first signal-side resonator having an input signal electrode, an output signal electrode, a first piezoelectric film, an input electrode film, and a common electrode film being commonly used by a second signal-side resonator and sandwiching the first piezoelectric film using the input electrode film, a second signal-side resonator having a second piezoelectric film formed in layers on the first piezoelectric film, an output electrode film, a common electrode film sandwiching the second piezoelectric film using the output electrode film and being acoustically coupled to the first signal resonator, and a ground-side resonator connected between the common electrode film and a ground electrode and operating in a specified resonant frequency and in an anti-resonant frequency almost conforming to resonant frequencies in which the first and second signal-side resonators operate.

13 Claims, 39 Drawing Sheets

FILTER DEVICE UTILIZING STACKED RESONATORS AND ACOUSTIC COUPLING AND BRANCHING FILTER USING SAME

BACKGROUND OF THE INVENTION

1. Field of the Invention

The present invention relates to a filter device made up of a piezo-resonator and a branching filter using the same.

2. Description of the Related Art

In recent years, a mobile telecommunication terminal including a portable cellular phone as a typical example is rapidly developing. It is desirable that, in order to meet a demand for its portability, au& the terminal is small in size, lightweight, and power-thrifty in particular. To make such the telecommunication terminal be small in size, lightweight, and power-thrifty, it is necessary that a filter device being used for the telecommunication terminal is also small in size, lightweight, and low in power loss. Moreover, to satisfy a demand for high-speed and large-capacity communications, it is also required that such the filter device has a wide passing bandwidth.

In response to this request, an SAW (Surface Acoustic Wave) filter and a filter device using the SAW filter are widely used.

In the SAW filter, a cross finger-shaped electrode in which electrode fingers each having a width being about one fourth of a wavelength of a surface acoustic wave to be propagated are alternately arranged is formed on a piezoelectric substrate so that the surface acoustic wave is received in an excited state. A line width of an electrode finger of the SAW filter being used in a system operating in a frequency band of 2 GHz is about 0.4 μm. In order to be used in a system operating in a higher frequency, an electrode having its line width of 0.4 μm or less has to be fabricated with high accuracy, which, however, has a probability that manufacturability is remarkably lowered. Therefore, it is thought that, achievement of operations in a further higher frequency by using the SAW filter has a difficulty.

In such the circumstance, a filter device using a piezoelectric thin film being one type of a device operating by employing a BAW (Bulk Acoustic Wave) filter comes into wide use. An operating frequency of the BAW device is determined by a thickness of a piezoelectric film being sandwiched between input/output electrodes. Since ceramic or quarts is conventionally used as a material for the piezoelectric film, it was difficult to fabricate the thin piezoelectric film with high accuracy using such the material and, therefore, the filter using the piezoelectric film has not been used in high frequency applications. However, in recent years, it is made possible to form a piezoelectric film by a depositing apparatus using a sputtering method or a like and, as a result, a piezoelectric film having a desired thickness can be obtained and the BAW device has now come to hold superiority in use in the high frequency applications. Moreover, an electrode that uses the RAW device serving as a thin film resonator filter is a plate electrode in which, unlike in the case of the SAW filter, use of a slender electrode is not required, thus making it possible to process signals having large power.

The conventional BAW device is constructed by forming one layer of a piezoelectric film on a substrate and arranging resonators in which the piezoelectric film is sandwiched between upper and lower electrodes so as to be plane and then electrically connecting each of the resonators by a ladder-connection method.

Moreover, technology to achieve a wide passing bandwidth in the ladder-type filter is disclosed in Japanese Patent Application Laid-open No. Hei 10-93375 in which an inductance element is connected to a parallel arm or in which a difference is given between a resonant frequency of each of resonators formed on a serial arm and an anti-resonant frequency of each of resonators formed on a parallel arm.

However, the conventional filter device has problems. That is, since the filter device generally uses 5 to 7 pieces of resonators, a chip area being no more than an area obtained by multiplying the number of resonators by a resonator area cannot be realized in the filter device having configurations described above.

Moreover, as the BAW device, an SCF (Stacked Crystals Filter) in which a resonator having two or more stacked piezoelectric films is arranged stereoscopically and/or a CRF (Coupled Resonator Filter) are known. The SCF, since it is a filter that operates in a narrow band, is not suitable for a filter that should operate in a wide band. The CRF, since it uses multiple modes, is suitable for a filter that should operate in a wide band, however, it suffers larger insertion loss due to its operational principles when compared with the case of the conventional ladder-type filter and, therefore, is not suitable for a filter that should be low in power loss.

Furthermore, when the ladder-type filter is to be realized by using a layer-stacked structure, since there is a bar that a characteristic is degraded due to mutual interference between serial-arm resonators or parallel-arm resonators being arranged in a layer-stacking direction, this fear must be removed when the ladder-type filter is constructed. If so, an advantage of using the layer-stacked structure is lost in the end.

SUMMARY OF THE INVENTION

In view of the above, it is an object of the present invention to provide a filter device which is low in power loss and small in size and can operate in a wide band.

According to a first aspect of the present invention, there is provided a filter device including:

at least one signal-side resonator that operates in a specified resonant frequency; and at least one ground-side resonator that operates in an anti-resonant frequency almost conforming to the resonant frequency in which the signal-side resonator operates;

wherein the signal-side resonator and the ground-side resonator are acoustically coupled partially or totally to each other.

By configuring above, an area occupied by the resonators is reduced by employing a layer-stacked structure, which enables the filter device to be small in size and, as a result, connecting paths being electrically connected are shortened, which enables the filter device to be low in power loss and he filter device can operate in a wide frequency band. Thus, the filter device being low in power loss, small in size, and operating in a wide frequency band can be obtained.

According to a second aspect of the present invention, there is provided a filter device including:

an input signal electrode and an output signal electrode;

at least one signal-side resonator being connected between the input signal electrode and the output signal electrode and operating in a specified resonant frequency; and at least one ground-side resonator being formed between a signal path connecting the input signal electrode to the output signal electrode and a ground electrode and operating in an anti-resonant frequency almost conforming to the resonant frequency in which the signal-side resonator operates;

wherein the signal-side resonator and the ground-side resonator are acoustically coupled partially and totally to each other.

By configuring above, an area occupied by the resonators is reduced by employing the layer-stacked structure, which enables the filter device to be small in size and, as a result, connecting paths being electrically connected are shortened, which enables the filter device to be low in power loss and the filter device can operate in a wide frequency band. Thus, the filter device being low in power loss, small in size and operating in a wide frequency band can be obtained.

According to a third aspect of the present invention, there is provided a filter device including:

a first signal-side resonator and a second signal-side resonator both operating in resonant frequencies almost conforming to one another and both being acoustically coupled to each other and both having a layer-stacked structure;

a ground-side resonator being connected to a common electrode film being commonly used by the first signal-side resonator and the second signal-side resonator or to a non-common electrode film being not commonly used by the first signal-side resonator and the second signal-side resonator, and operating in an anti-resonant frequency almost conforming to the resonant frequencies in which the first and second signal-side resonators operate.

By configuring above, an area occupied by the resonators is reduced by employing the layer-stacked structure, which enables the filter device to be small in size and, as a result, connecting paths being electrically connected are shortened, which enables the filter device to be low in power loss and the filter device can operate in a wide frequency band. Thus, the filter device being low in power loss, small in size, and operating in a wide frequency band can be obtained.

According to a fourth aspect of the present invention, there is provided a filter device including:

a first signal-side resonator and a second signal-side resonator both operating in resonant frequencies almost conforming to one another and both being acoustically coupled to each other; and a ground-side resonator being connected to at least one common electrode film being commonly used by the first signal-side resonator and the second signal-side resonator or to at least one non-common electrode film being not commonly used by the first signal-side resonator and the second signal-side resonator, and operating in an anti-resonant frequency almost conforming to the resonant frequencies in which the first and second signal-side resonators operate;

wherein the common electrode film and the non-common electrode film to which the ground-side resonator is not connected are not connected to a ground electrode.

By configuring above, an area occupied by the resonators is reduced by employing the layer-stacked structure, which enables the filter device to be small in size and, as a result, connecting paths being electrically connected are shortened, which enables the filter device to be low in power loss and the filter device can operate in a wide frequency band. Thus, the filter device being low in power loss, small in size, and operating in a wide frequency baud can be obtained.

According to a fifth aspect of the present invention, there is provided a filter device including:

an input signal electrode and an output signal electrode;

a first signal-side resonator having a first piezoelectric film, an input electrode film connected to the input signal electrode, and a common electrode film being commonly used by other signal-side resonator and sandwiching the first piezoelectric film using the input electrode film, and operating in a specified resonant frequency and in a specified anti-resonant frequency;

a second signal-side resonator having a second piezoelectric film formed on the first piezoelectric film in a layer-stacking direction, an output electrode film being connected to the output signal electrode, and a common electrode film being commonly used by other signal-side resonator and sandwiching the second piezoelectric film using the output electrode film, and operating in a specified resonant frequency and in a specified anti-resonant frequency and being acoustically connected to the first signal-side resonator; and a ground-side resonator being connected between the common electrode film and ground electrode and operating in a specified resonant frequency and in an anti-resonant frequency almost conforming to resonant frequencies in which the first signal-side resonator and the second signal-side resonator operate.

By configuring as above, an area occupied by the resonators is reduced by employing the layer-stacked structure, which enables the filter device to be small in size and, as a result, connecting paths being electrically connected are shortened, which enables the filter device to be low in power loss and the filter device can operate in a wide frequency band. Thus, the filter device being low in power loss, small in size, and operating in a wide frequency band can be obtained.

In the foregoing, a preferable mode is one wherein at least one third signal-side resonator having a third piezoelectric film formed between the first piezoelectric film and the second piezoelectric film and having two common electrode films being commonly used by other signal-side resonator and sandwiching the third piezoelectric film, and operating in a specified resonant frequency and in a specified anti-resonant frequency and being acoustically coupled to the first signal-side resonator and to the second signal-side resonator is formed between the first signal-side resonator and the second signal-side resonator.

By configuring as above, the filter device being low in power loss, small in size, and operating in a wide frequency band can be obtained.

According to a sixth aspect of the present invention, there is probed a filter device including:

an input signal electrode and an output signal electrode;

a first signal-side resonator having a first piezoelectric film, an input electrode film connected to the input signal electrode, and a common electrode film being commonly used by other signal-side resonator and sandwiching the first piezoelectric film using the input electrode film, and operating in a specified resonant frequency and in a specified anti-resonant frequency;

a second signal-side resonator having the first piezoelectric film, an output electrode film connected to the output signal electrode, and a common electrode film being commonly used by other signal-side resonator and sandwiching the first piezoelectric film using the output electrode film, and operating in a specified resonant frequency and in a specified anti-resonant frequency;

a third signal-side resonator having a second piezoelectric film formed on the first piezoelectric film in a layer-stacking direction, a common electrode film being commonly used by other signal-side resonator, and an intermediate electrode film sandwiching the second piezoelectric film using the common electrode film, and operating in a specified resonant frequency and in a specified anti-resonant frequency and being acoustically coupled to the first signal-side resonator;

a fourth signal-side resonator having the second piezoelectric film, a common electrode film being commonly used by other signal-side resonator, and an intermediate electrode film connected to the intermediate electrode film in the third signal-side resonator and sandwiching the second piezoelectric film using the common electrode film, and operating in a specified resonant frequency and in a specified anti-resonant frequency and being acoustically coupled to the second signal-side resonator; and a ground-side resonator being formed between the common electrode film and a ground electrode and operating in a specified resonant frequency and in an anti-resonant frequency almost conforming to resonant frequencies in which the first signal-side resonator, the second signal-side resonator, the third signal-side resonator, and the fourth signal-side resonator operate.

By configuring as above, the filter device being low in power loss, small in size, and operating in a wide frequency band can be obtained.

According to a seventh aspect of the present invention, there is provided a filter device including:

first and second ground-side resonators operating in anti-resonant frequencies almost conforming to one another and being acoustically coupled to each other and connecting a common electrode film being commonly used by the first and second ground-side resonators to a ground electrode and having a layer-stacked structure; and a signal-side resonator formed between a non-common electrode film in the first ground-side resonator and a non-common electrode film in the second ground-side resonator and operating in resonant frequencies almost conforming to anti-resonant frequencies in which the first and second ground-side resonators operate.

By configuring as above, the filter device being low in power loss, small in size, and operating in a wide frequency band can be obtained.

In the foregoing, a preferable mode is one wherein the signal-side resonator contains a common electrode film formed on a same layer as the first ground-side resonator or the second ground-side resonator are formed.

By configuring as above, the filter device being low in power loss, small in size, and operating in a wide frequency band can be obtained.

Also, a preferable mode is one wherein the signal-side resonator is a piezoelectric thin-film resonator, surface acoustic wave resonator, or dielectric resonator.

By configuring as above, the filter device being low in power loss, small in size, and operating in a wide frequency band can be obtained.

According to an eighth aspect of the present invention, there is provided a filter device including:

an input signal electrode and an output signal electrode;

a signal-side resonator being connected between the input signal electrode and the output signal electrode and operating in a specified resonant frequency and in a specified anti-resonant frequency;

a first ground-side resonator having a first piezoelectric film, an input electrode film connected to the input signal electrode, and a common electrode film being commonly used by other ground-side resonator and sandwiching the first piezoelectric film using the input electrode film and being connected to a ground electrode, and operating in a specified resonant frequency and in an anti-resonant frequency almost conforming to a resonant frequency in which the signal-side resonator operate;

a second ground-side resonator having a second piezoelectric film formed on the first piezoelectric film in a layer-stacking direction, an output electrode film connected to the output signal electrode, and a common electrode film being commonly used by other ground-side resonator and sandwiching the second piezoelectric film using the output electrode film and being connected to the ground electrode, and operating in a specified resonant frequency and in an anti-resonant frequency almost conforming to a resonant frequency in which the signal-side resonator operates and being acoustically coupled to the first ground-side resonator.

By configuring as above, the filter device being low in power loss, small in size, and operating in a wide frequency band can be obtained.

According to a ninth aspect of the present invention, there is provided a filter device including:

an input signal electrode and an output signal electrode;

a signal-side resonator being connected between the input signal electrode and the output signal electrode and operating in a specified resonant frequency and in a specified anti-resonant frequency;

a first ground-side resonator having a first piezoelectric film, a first ground-electrode film connected to a ground electrode, and a common electrode film being commonly used by other ground-side resonator and sandwiching the first piezoelectric film using the first ground electrode film and being formed between the input signal electrode and the output signal electrode, and operating in a specified resonant frequency and in an anti-resonant frequency almost conforming to a resonant frequency in which the signal-side resonator operate; and a second ground-side resonator having a second piezoelectric film formed on the first piezoelectric film in a layer-stacking direction, a second ground electrode film connected to the ground electrode and a common electrode film being commonly used by other ground-side resonator and sandwiching the second piezoelectric film using the second ground electrode film and being formed between the input signal electrode and the output signal electrode, and operating in a specified resonant frequency and in an anti-resonant frequency almost conforming to a resonant frequency in which the signal-side resonator rotates and being acoustically coupled to the first ground-side resonator.

By configuring as above, the filter device being low in power loss, small in size, and operating in a wide frequency band can be obtained.

According to a tenth aspect of the present invention, there is provided a filter device including:

an input signal electrode and an output signal electrode;

a signal-side resonator being connected between the input signal electrode and the output signal electrode and operating in a specified resonant frequency and in a specified anti-resonant frequency;

a first ground-side resonator having a first piezoelectric film, an input electrode film connected to the input signal electrode, and a common electrode film being commonly used by other ground-side resonator and being connected to a ground electrode and sandwiching the first piezoelectric film using the input electrode film, and operating in a specified resonant frequency and in an anti-resonant frequency almost conforming to a resonant frequency in which the signal-side resonator operates, a second ground-side resonator having the first piezoelectric film, an output electrode film being connected to the output signal electrode, and a common electrode film being commonly used by other ground-side resonator and being connected to the ground electrode and sandwiching the first piezoelectric film using the output electrode film, and operating in a specified resonant frequency and in an anti-resonant frequency almost conforming to a resonant frequency in which the signal-side resonator operates, a third ground-side resonator having a second piezoelectric film formed on the first piezoelectric film in a layer-stacking direction, a common electrode film being commonly used by other ground-side resonator, and an intermediate electrode film sandwiching the second piezoelectric film using the common electrode film, and operating in a specified resonant frequency and in an anti-resonant frequency almost conforming to a resonant frequency in which the signal-side resonator operates; and a fourth ground-side resonator having the second piezoelectric film, a common electrode film being commonly used by other ground-side resonator, and an intermediate electrode film being connected to the intermediate electrode film in the third ground-side resonator and sandwiching the second piezoelectric film using the common electrode film, operating in a specified resonant frequency and in an anti-resonant frequency almost conforming to a resonant frequency in which the signal-side resonator operates.

By configuring as above, the filter device being low in power loss, small in size, and operating in a wide frequency band can be obtained.

According to an eleventh aspect of the present invention, there is provided a filter device including:

an input signal electrode and an output signal electrode;

a signal-side resonator having a first piezoelectric film, an input electrode film connected to the input signal electrode, and an output electrode film connected to the output signal electrode and sandwiching the first piezoelectric film using the input electrode film, and operating in a specified resonant frequency and in a specified anti-resonant frequency; and a ground-side resonator having a second piezoelectric film formed on the first piezoelectric film in a layer-stacking direction and a ground electrode film being connected to a ground electrode and sandwiching the second piezoelectric film using the output electrode film, and operating in a specified resonant frequency and in an anti-resonant frequency almost conforming to a resonant frequency in which the signal-side resonator operates and being acoustically coupled to the signal-side resonator.

By configuring as above, the filter device being low in power loss, small in size, and operating in a wide frequency band can be obtained.

According to a twelfth aspect of the present invention, there is provided a filter device including:

an input signal electrode and an output signal electrode;

a ground-side resonator having a first piezoelectric film, an input electrode film connected to the input signal electrode, and a ground electrode film being connected to a ground electrode and sandwiching the first piezoelectric film using the input electrode film, and operating in a specified resonant frequency and in an anti-resonant frequency; and a signal-side resonator having a second piezoelectric film formed on the first piezoelectric film in a layer-stacking direction, the input electrode film and an output electrode film being connected to the output electrode film and sandwiching the second piezoelectric film using the input electrode film, and operating in a resonant frequency almost conforming to an anti-resonant frequency in which the ground-side resonator operates and in a specified anti-resonant frequency and being acoustically coupled to the ground-side resonator.

By configuring as above, the filter device being low in power loss, small in size, and operating in a wide frequency band can be obtained.

According to a thirteenth aspect of the present invention, there is provided a filter device including:

an input signal electrode and an output signal electrode;

a signal-side resonator having a first piezoelectric film, an input electrode film connected to the input signal electrode, and an output electrode film being connected to the output signal electrode and sandwiching the first piezoelectric film using the input electrode film, and operating in a specified resonant frequency and in a specified anti-resonant frequency;

a first ground-side resonator having a second piezoelectric film formed on the first piezoelectric film in a layer-stacking direction and a first ground electrode film being connected to a ground electrode and sandwiching the second piezoelectric film using the output electrode film, and operating in a specified resonant frequency and in an anti-resonant frequency almost conforming to a resonant frequency in which the signal-side resonator operates and being acoustically coupled to the signal-side resonator; and a second ground-side resonator having a third piezoelectric film formed on the first piezoelectric film in a layer-stacking direction, a ground electrode film being connected to a ground electrode and sandwiching the third piezoelectric film using the input electrode film, and operating in a specified resonant frequency and in an anti-resonant frequency almost conforming to a resonant frequency in which the signal-side resonator operates and being acoustically coupled to the signal-side resonator.

By configuring as above, the filter device being low in power loss, small in size, and operating in a wide frequency band can be obtained.

According to a fourteenth aspect of the present invention, there is provided filter device including:

an input signal electrode and an output signal electrode;

a first signal-side resonator having a first piezoelectric film, an input electrode film connected to the input signal electrode and a common electrode film being commonly used by a first ground-side resonator and sandwiching the first piezoelectric film using the input electrode film, and operating in a specified resonant frequency and in a specified anti-resonant frequency;

a second signal resonator having a first piezoelectric film, an output electrode film connected to the output signal electrode, and a common electrode film being commonly used by a second ground-side resonator and sandwiching the first piezoelectric film using the output electrode film, and operating in a specified resonant frequency and in a specified anti-resonant frequency;

a first ground-side resonator having a second piezoelectric film formed on the first piezoelectric film in a layer-stacking direction and a first ground electrode film being connected to a ground electrode and sandwiching the second piezoelectric film using the common electrode, and operating in a specified resonant frequency and in an anti-resonant frequency almost conforming to a resonant frequency in which the signal-side resonator operates and being acoustically coupled to the first signal-side resonator, and a second ground-side resonator having a second piezoelectric film formed on the first piezoelectric film in a layer-stacking direction and a second ground electrode film being connected to a ground electrode and sandwiching the second piezoelectric film using the common electrode film, and operating in a specified resonant frequency and in an anti-resonant frequency almost conforming to a resonant frequency in which the signal-side resonator operates and being acoustically coupled to the second signal-side resonator.

By configuring as above, the filter device being low in power loss, small in size, and operating in a wide frequency band can be obtained.

In the foregoing, a preferable mode is one wherein at least one signal-side resonator is formed between the two common electrodes.

By configuring as above, the filter device being low in power loss, small in size, and operating in a wide frequency band can be obtained.

According to a fifteenth aspect of the present invention, there is provided a filter device including:

an input signal electrode and an output signal electrode;

a first signal-side resonator having a first piezoelectric film, an input electrode film connected to the input signal electrode, and a common electrode film being commonly used by other signal-side resonator and sandwiching the first piezoelectric film using the input electrode film, and operating in a specified resonant frequency and in a specified anti-resonant frequency;

a second signal-side resonator having a second piezoelectric film formed on the first piezoelectric film in a layer-stacking direction, an output electrode film connected to the output signal electrode, and a common electrode film being commonly used by other signal-side resonator and sandwiching the second piezoelectric film using the output electrode film, and operating in a specified resonant frequency and in a specified anti-resonant frequency and being acoustically coupled to the first signal-side resonator;

a first ground-side resonator having a first piezoelectric film, an input electrode film connected to the input signal electrode and a common electrode film being commonly used by other ground-side resonator and sandwiching the first piezoelectric film using the input electrode film and being connected to a ground electrode, and operating in a specified resonant frequency and in an anti-resonant frequency almost conforming to a resonant frequency in which the signal-side resonator operates; and a second ground-side resonator having the second piezoelectric layer, an intermediate being connected to the common electrode film in the signal-side resonator, and a common electrode film being commonly used by other ground-side resonator and sandwiching the second piezoelectric film using the intermediate electrode film and being connected to the ground electrode, and operating in a specified resonant frequency and in an anti-resonant frequency almost conforming to a resonant frequency in which the signal-side resonator and being acoustically coupled to the first ground-side resonator.

By configuring as above, the filter device being low in power loss, small in size, and operating in a wide frequency band can be obtained.

According to a sixteenth aspect of the present invention, there is provided a filter device including:

an input signal electrode and an output signal electrode;

a first signal-side resonator having a first piezoelectric film, an input electrode film connected to the input signal electrode, and a common electrode film being commonly used by other signal-side resonator and sandwiching the first piezoelectric film using the input electrode film, and operating in a specified resonant frequency and in an anti-resonant frequency;

a second signal-side resonator having a second piezoelectric film formed on the first piezoelectric film in a layer-stacking direction, an intermediate electrode film connected to other intermediate electrode film, and a common electrode film being commonly used by other signal-side resonator and sandwiching the second piezoelectric film using the intermediate electrode film, and operating in a resonant frequency and in a specified anti-resonant frequency and being acoustically coupled to the first signal-side resonator;

a third signal-side resonator having the first piezoelectric film, an output electrode film connected to the output signal electrode, and a common electrode film being commonly used by other signal-side resonator and sandwiching the first piezoelectric film using the output electrode film, and operating in a specified resonant frequency and in a specified anti-resonant frequency;

a fourth signal-side resonator having the second piezoelectric film, an intermediate electrode film connected to other intermediate electrode film, and a common electrode film being commonly used by other signal-side resonator and sandwiching the second piezoelectric film using the intermediate electrode film, and operating in a specified resonant frequency in a specified anti-resonant frequency and being acoustically coupled to the third signal-side resonator;

a first ground-side resonator having the first piezoelectric film, an intermediate electrode film connected to the common electrode film in the signal-side resonator, and a common electrode film being commonly used by other ground-side resonator and sandwiching the first piezoelectric film using the intermediate electrode film and being connected to a ground electrode, and operating in a specified resonant frequency and in an anti-resonant frequency almost conforming to a resonant frequency in which the signal-side resonator operates; and a second ground-side resonator having the second piezoelectric film, an intermediate electrode film connected to the common electrode film in the signal-side resonator, and a common electrode film being commonly used by other ground-side resonator and sandwiching the second piezoelectric film using the intermediate electrode film and being connected to the ground electrode, and operating in a specified resonant frequency and in a specified anti-resonant frequency almost conforming to a resonant frequency in which the signal-side resonator operates and being acoustically coupled to the first ground-side resonator.

By configuring as above, the filter device being low in power loss, small in size, and operating in a wide frequency band can be obtained.

According to a seventeenth aspect of the present invention, there is provided a filter device including:

an input signal electrode and an output signal electrode;

a first ground-side resonator having a first piezoelectric film, a first ground-side input electrode film connected to the input signal electrode, and a common electrode film being commonly used by other ground-side resonator and sandwiching the first piezoelectric using the first ground-side input electrode film and being connected to a ground electrode, and operating in a specified resonant frequency and in an anti-resonant frequency almost conforming to a resonant frequency in which the signal-side resonator operates;

a second ground-side resonator having a second piezoelectric film formed on the first piezoelectric film in a layer-stacking direction, a second ground-side input electrode film connected to the input signal electrode, and a common electrode film being commonly used by other ground-side resonator and sandwiching the second piezoelectric film using the second ground-side input electrode film and being connected to the ground electrode, and operating in a specified resonant frequency and in an anti-resonant frequency almost conforming to a resonant frequency in which the signal-side resonator operates and being acoustically coupled to the first ground-side resonator;

a signal-side resonator having a first piezoelectric film, and a signal-side input electrode connected to the input signal electrode, and an output electrode film being connected to the output signal electrode and sandwiching the first piezoelectric film using the signal-side input electrode film, and operating in a specified resonant frequency and in a specified anti-resonant frequency; and a third ground-side resonator having the second piezoelectric film, a ground electrode film being connected to the ground electrode and sandwiching the second piezoelectric film using the output electrode film, and operating in a specified resonant frequency and in an anti-resonant frequency almost conforming to a resonant frequency in which the signal-side resonator operates.

By configuring as above, the filter device being low in power loss, small in size, and operating in a wide frequency band can be obtained.

According to an eighteenth aspect of the present invention, there is provided a filter device including:

an input signal electrode and an output signal electrode;

a first signal-side resonator having a first piezoelectric film, an input electrode film connected to the input signal electrode, and a common electrode film being commonly used by other signal-side resonator and sandwiching the first piezoelectric film using the input electrode film, and operating in a specified resonant frequency and in a specified anti-resonant frequency;

a second signal-side resonator having a second piezoelectric film formed on the first piezoelectric film in a layer-stacking direction, an intermediate electrode film connected to other common electrode film, and a common electrode film being commonly used by other signal-side resonator and sandwiching the second piezoelectric film using the intermediate electrode film, and operating in a specified resonant frequency and in a specified anti-resonant frequency and being acoustically coupled to the first signal-side resonator;

a third signal-side resonator having a first piezoelectric film, an output electrode film connected to the output signal electrode, a common electrode film being connected to the intermediate electrode film and sandwiching the first piezoelectric film using the output electrode film, and operating in a specified resonant frequency and in a specified anti-resonant frequency; and a ground-side resonator having the second piezoelectric film, a ground electrode film being connected to a ground electrode and sandwiching the second piezoelectric film using the common electrode film in the third signal-side resonator, and operating in a specified resonant frequency and in an anti-resonant frequency almost conforming to a resonant frequency in which the signal-side resonator and being acoustically coupled to the third signal-side resonator.

By configuring as above, the filter device being low in power loss, small in size, and operating in a wide frequency band can be obtained.

According to a nineteenth aspect of the present invention, there is provided a filter device including:

two or more ground-side resonators operating in anti-resonant frequencies almost conforming to one another and being acoustically coupled to one anther and having a non-common electrode film and connecting a common electrode film being commonly used by the two or more ground-side resonator to a ground electrode and having a layer-stacked structure; and two or more signal-side resonators operating in resonant frequencies almost conforming to an anti-resonant frequency in which the ground-resonator operates and being acoustically coupled to one another and wherein one non-common electrode film is connected to one non-common electrode in the ground-side resonator and another non-common electrode or the common electrode being commonly used by the two or more signal-side resonators is connected to another non-common electrode film in the ground-side resonator and being stacked in layers together with the ground-side resonators.

By configuring as above, the filter device being low in power loss, small in size, and operating in a wide frequency band can be obtained.

According to a twentieth aspect of the present invention, there is provided a filter device including:

two or more signal-side resonators operating in resonant frequencies almost conforming to one another and being acoustically coupled to one another and connecting a ground-side resonator to at least either of a common electrode film being commonly used by the two or more signal-side resonators or a non-common electrode film being not commonly used by them and having a layer-stacked structure.

By configuring as above, the filter device being low in power loss, small in size, and operating in a wide frequency band can be obtained.

According to a twenty-first aspect of the present invention, there is provided a filter device including:

two or more ground-side resonators operating in anti-resonant frequencies almost conforming to one another and being acoustically coupled to one another and connecting a common electrode film being commonly used by the two or more ground-side resonators to a ground electrode, and having a layer-stacked structure.

In the foregoing, a preferable mode is one wherein a dielectric layer or an acoustic reflecting layer being formed between the common electrode films.

Also, a preferable mode is one wherein an inductor element is connected between the common electrode film and the ground electrode or between the non-common electrode and the ground electrode.

Also, a preferable mode is one wherein an inductor element is connected to at least either of the input signal electrode or the output signal electrode.

Also, a preferable mode is one wherein a film thickness of a piezoelectric film containing the signal-side resonator is smaller than that of a piezoelectric film not containing the signal-side resonator.

Furthermore, a preferable mode is one wherein the filter device is constructed of an SMR (Solidly-Mounted Resonator)-type piezo-resonator or a diaphram-type piezo-resonator.

According to a twenty-second aspect of the present invention, there is provided a branching filter using two or more filter devices described above.

With the above configuration, since the layer-stacked structure is employed, an area occupied by the resonator can be reduced, which enables the filter device to be small in size and connecting paths being electrically connected to one another can be also shortened, which enables the filter device to be low in power loss. Furthermore, the filter device can have a wide frequency band characteristic being equal to that of the conventional ladder-type filter device, which enables the filter device to be low in power loss and small in size, and to operate in a wide frequency band.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings. The filter device of the present invention is made up of at least one signal-side resonator operating in a specified resonant frequency and at least one ground-side resonator operating in an anti-resonant frequency conforming to the resonant frequency in which the signal-side resonator operates and is characterized in that the signal-side resonator and ground-side resonator are acoustically coupled partially or totally to each other. The signal-side resonator is formed between an input signal electrode and an output signal electrode and the ground-side resonator is formed between a signal line used to connect an input signal electrode to an output signal electrode and a ground electrode.

In the attached drawings, the same reference numbers are assigned to the same components and duplicate descriptions are omitted. Moreover, the embodiments of the present invention are effective when the present invention is carried out and the present invention is not limited to the embodiments described below.

First Embodiment

Figure 1:
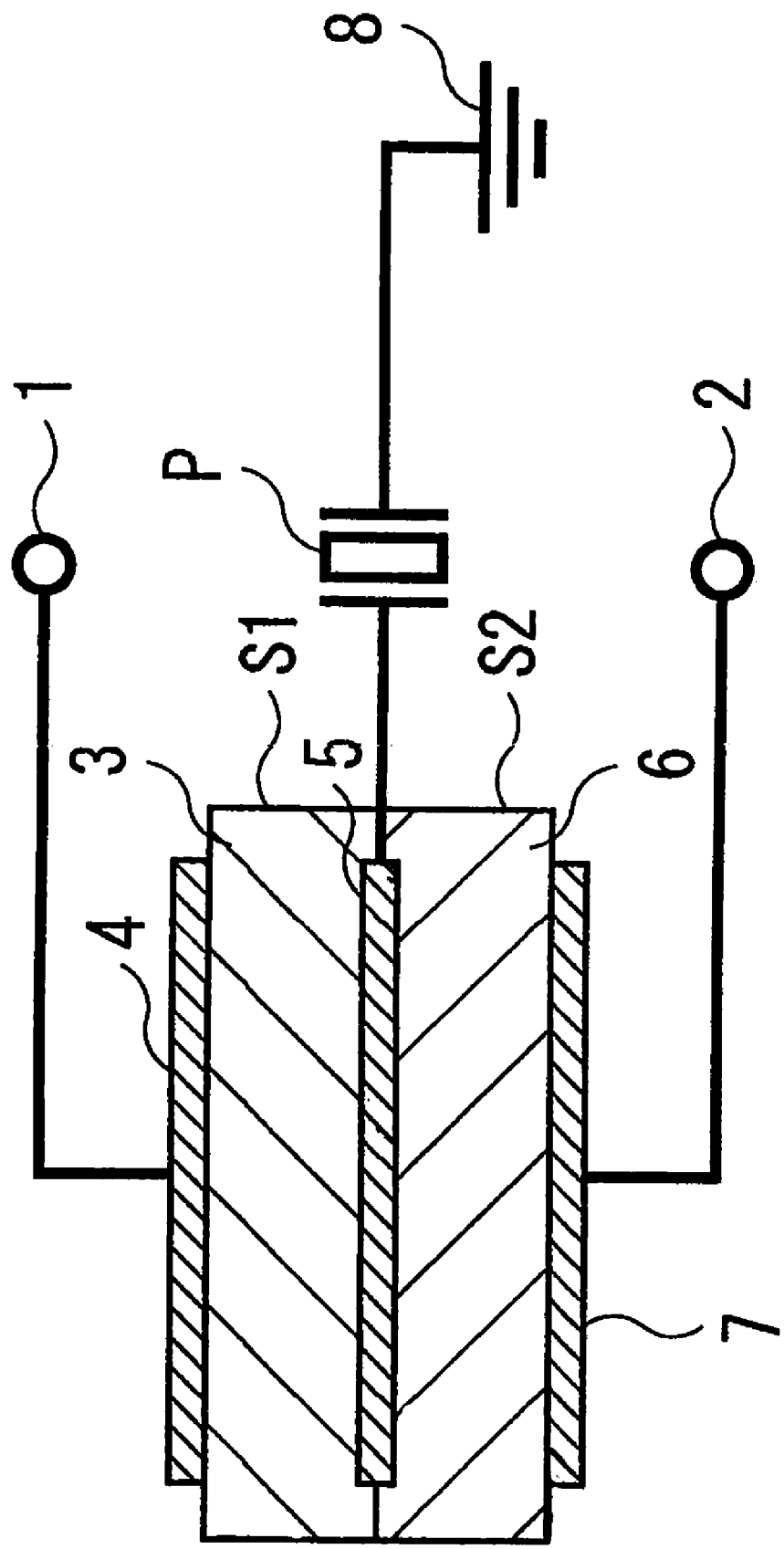
FIG. 1 is a diagram schematically showing one example of configurations of a filter device according to a first embodiment of the present invention.
Figure 2:
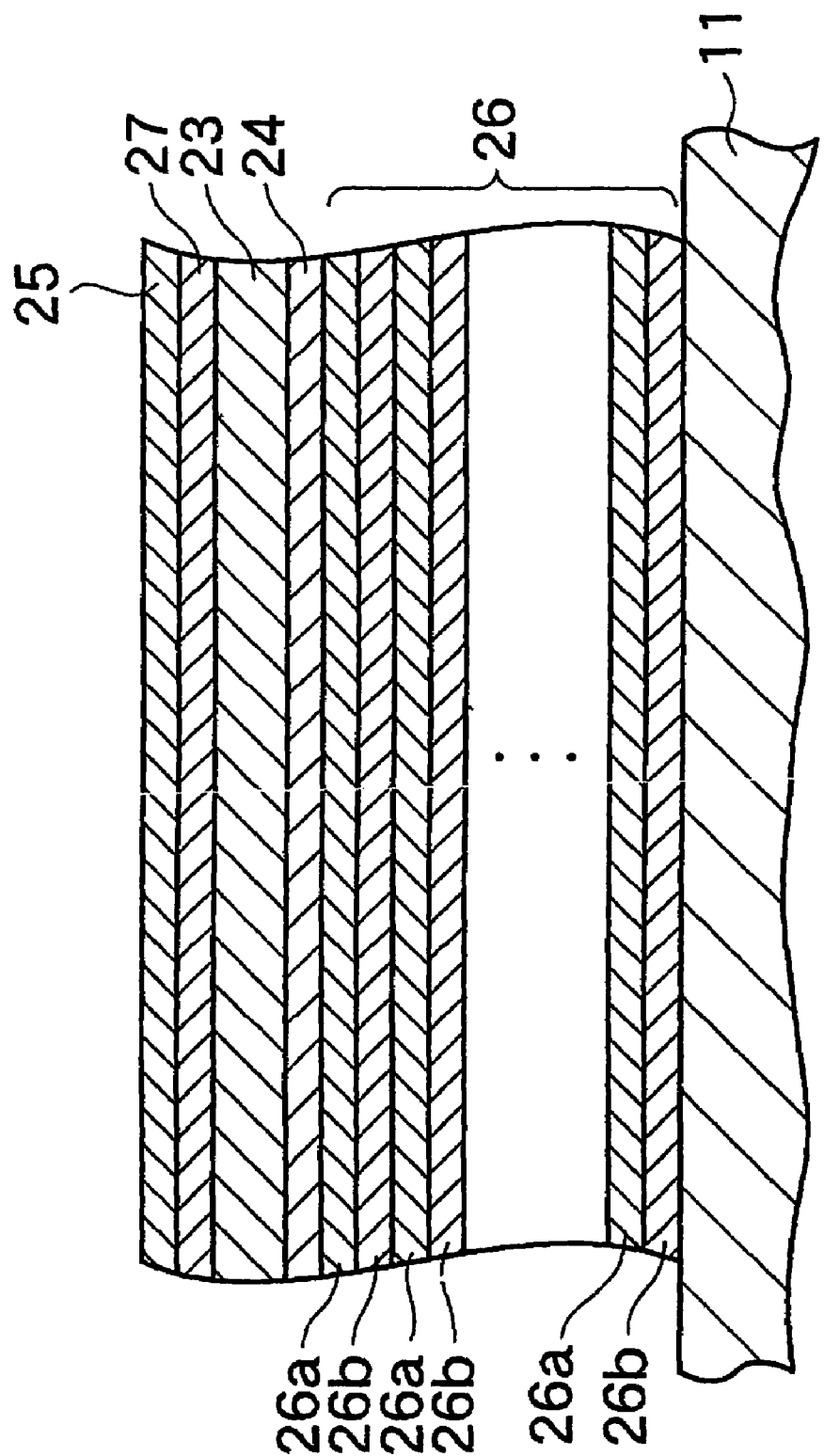
FIG. 2 is a cross-sectional view illustrating a piezo-resonator making up the filter device shown in FIG. 1.
Figure 3:
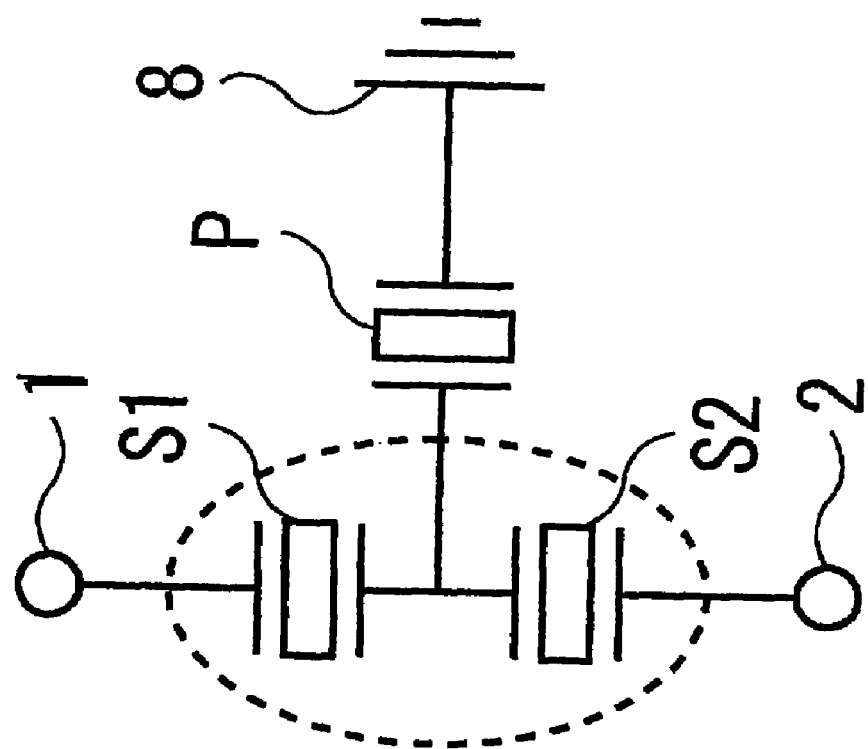
FIG. 3 is a diagram showing an equivalent circuit of the filter device shown in FIG. 1.
Figure 4:
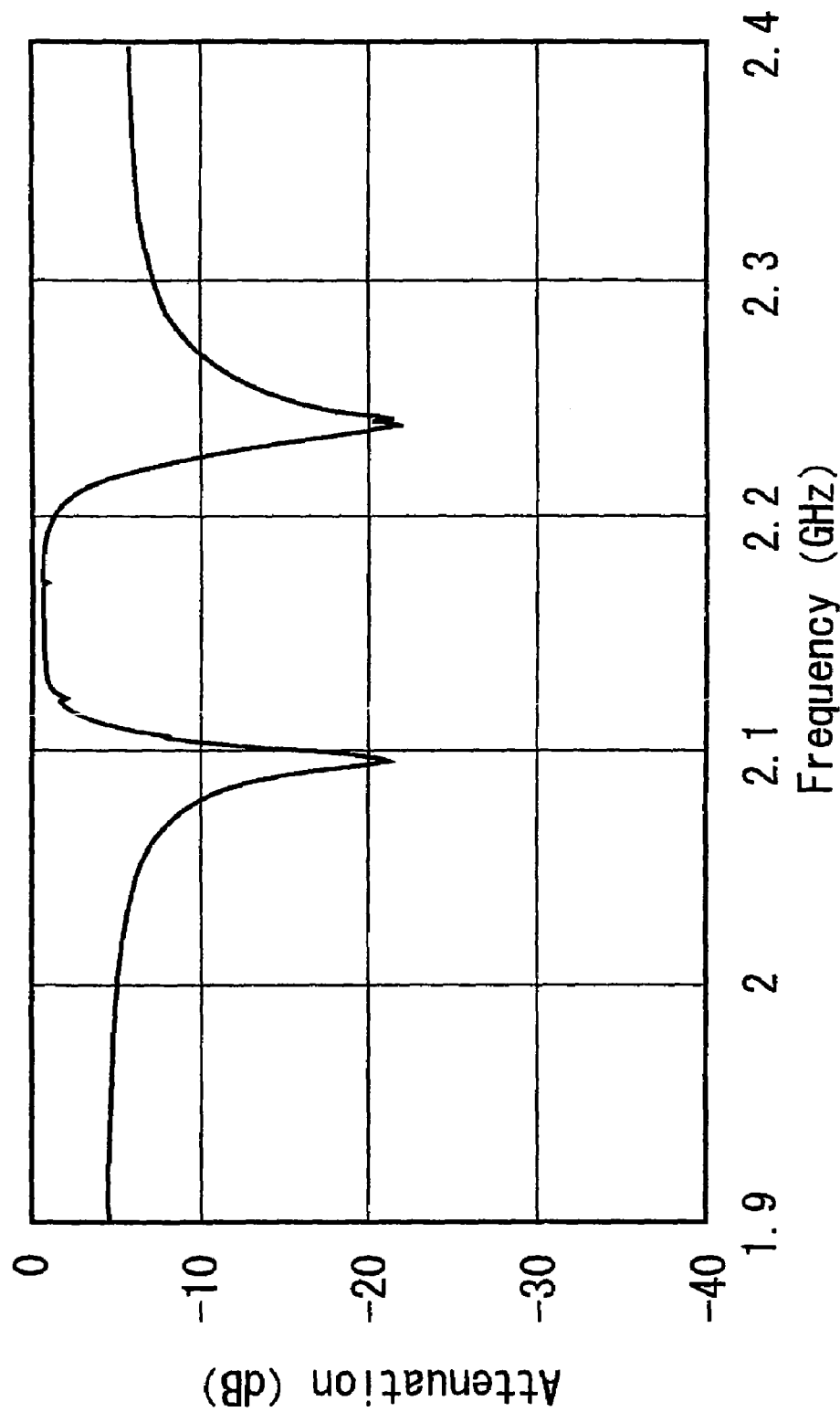
FIG. 4 is a graph showing a frequency characteristic of the filter device shown in FIG. 1.
Figure 5:
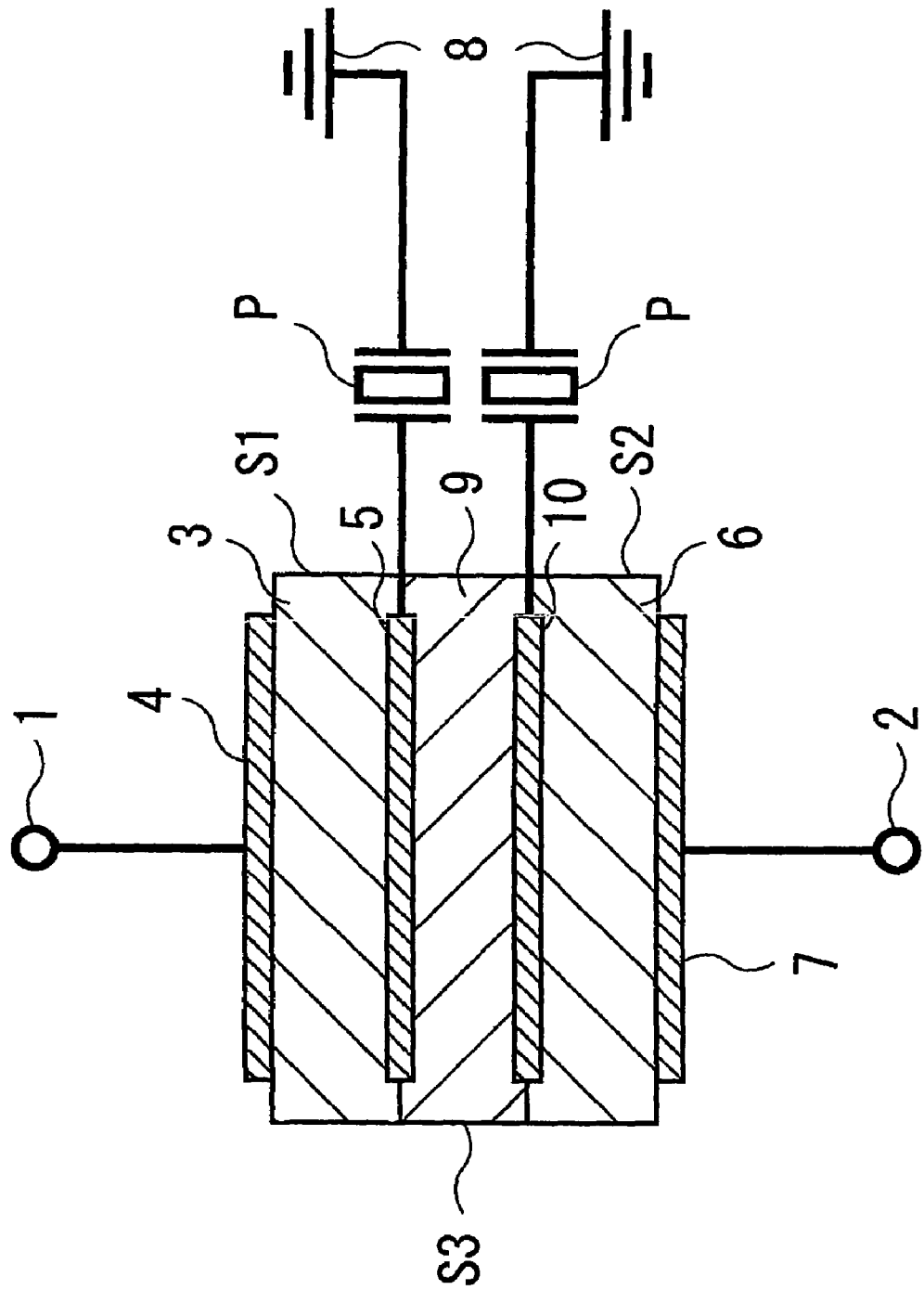
FIG. 5 is a diagram schematically showing another example of the configurations of the filter device according to the first embodiment of the present intention.
Figure 6:
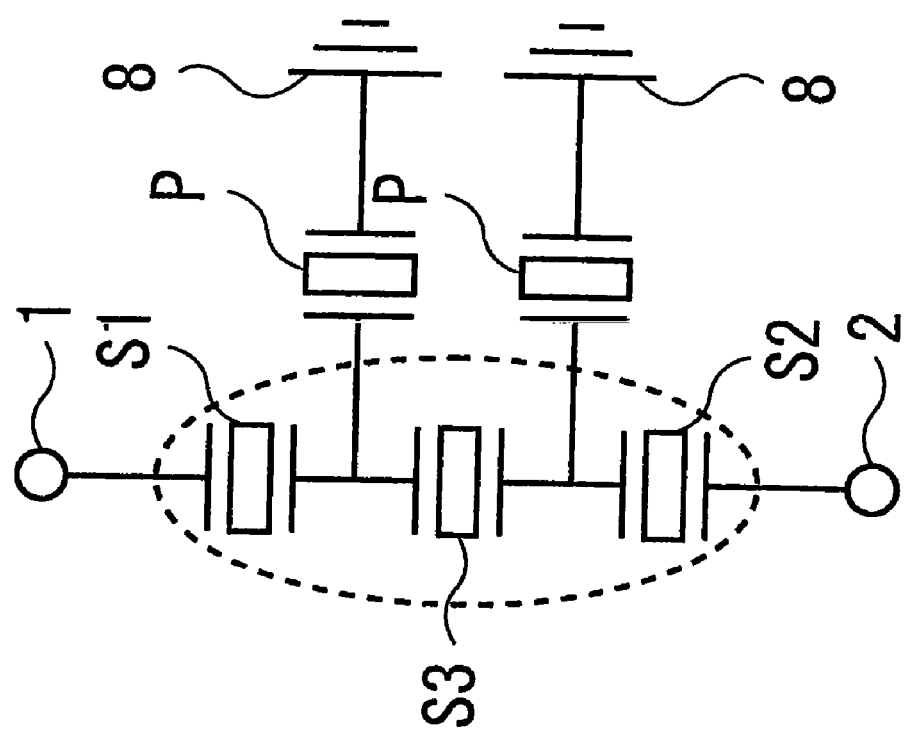
FIG. 6 is a diagram showing an equivalent circuit of the filter device shown in FIG. 5.
Figure 7:
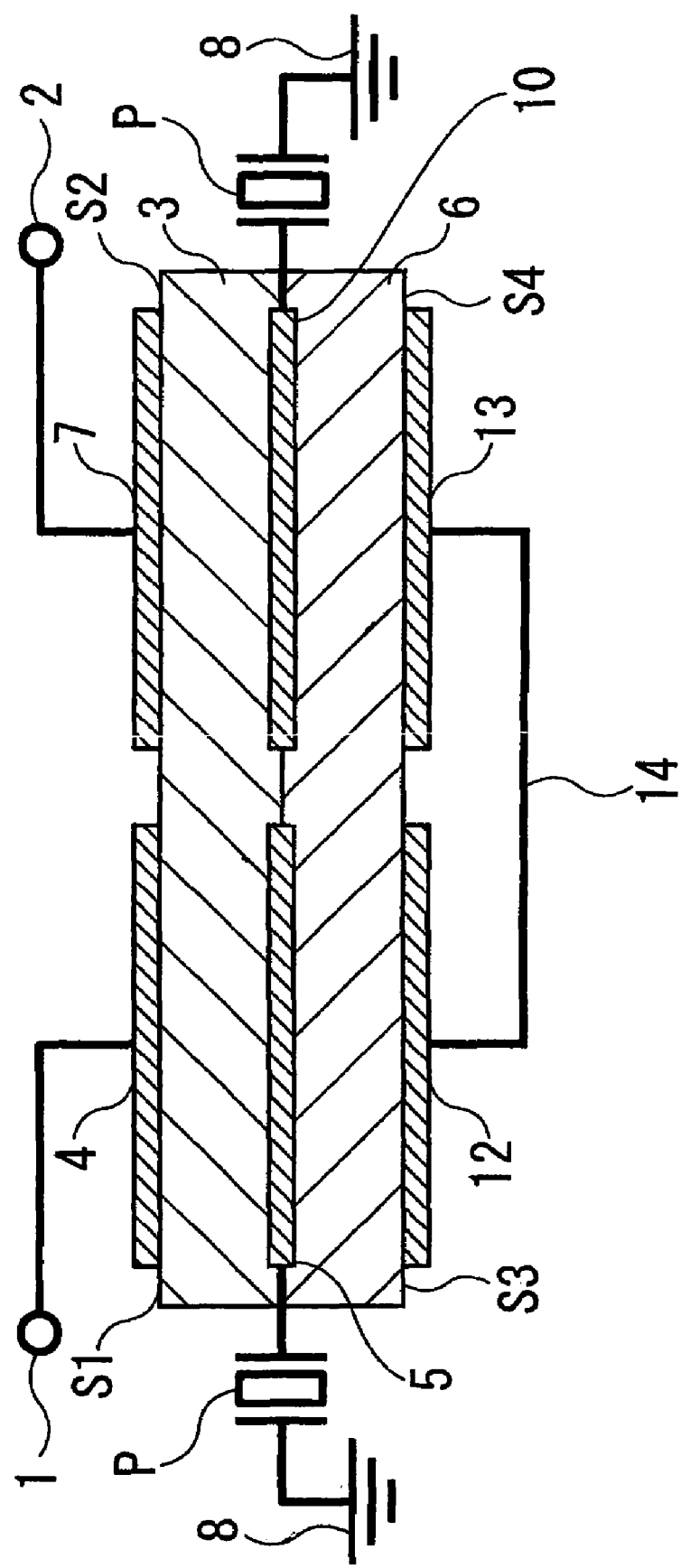
FIG. 7 is a diagram schematically showing still another example of the configurations of the filter device according to the first embodiment of the present invention.
Figure 8:
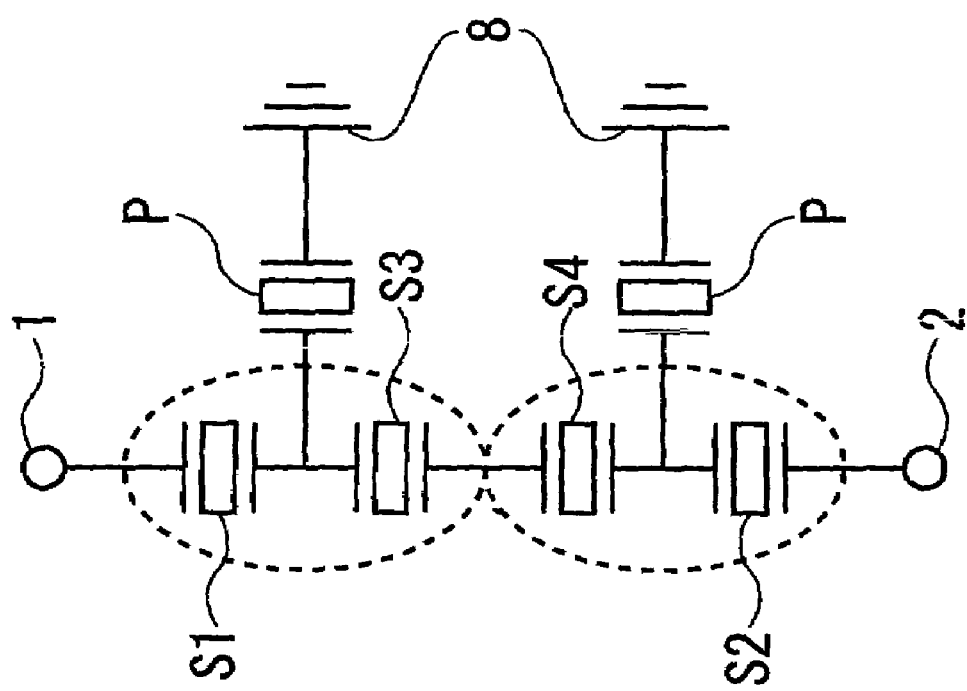
FIG. 8 is a diagram showing an equivalent circuit of the filter device shown in FIG. 7.
Figure 9:
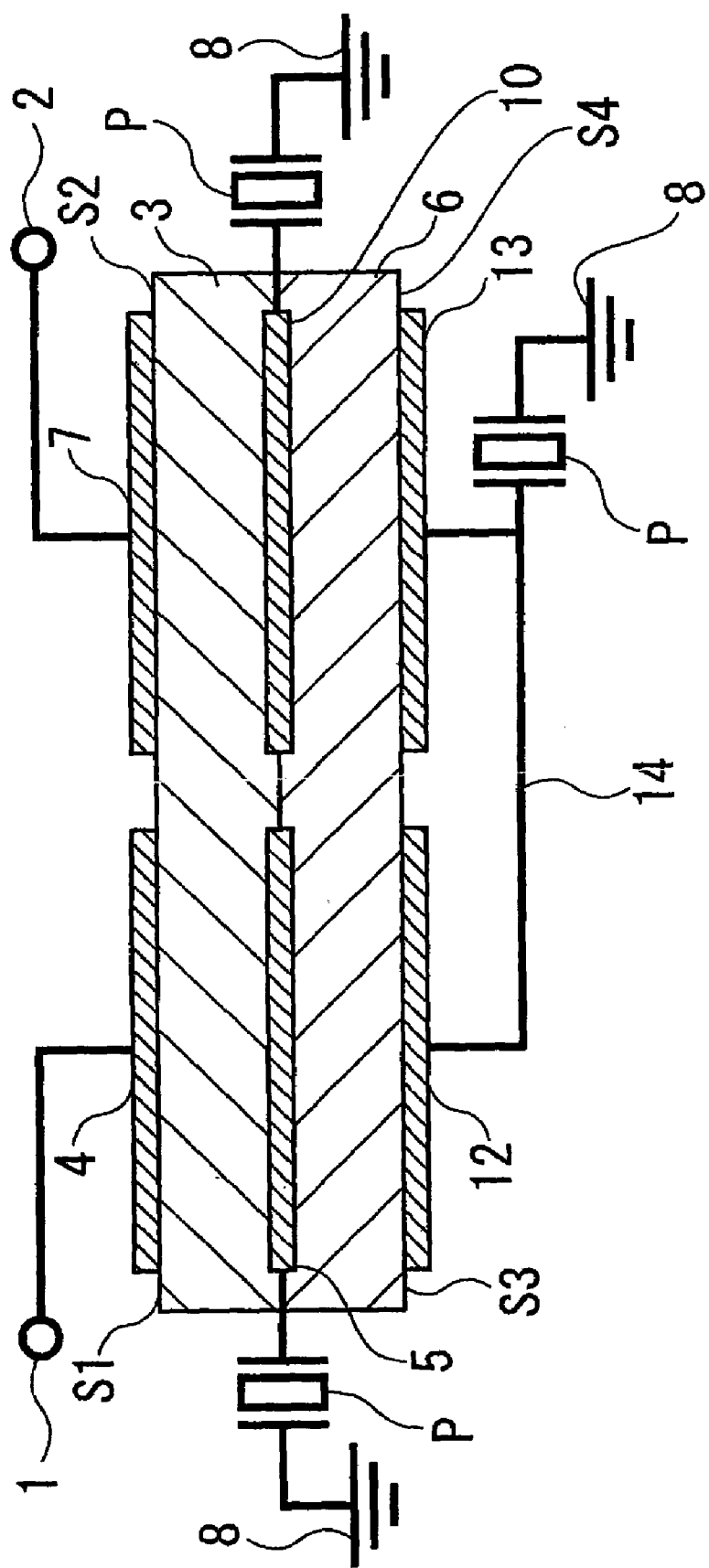
FIG. 9 is a diagram schematically showing still another example of the configurations of the filter device according to the first embodiment of the present invention.
Figure 10:
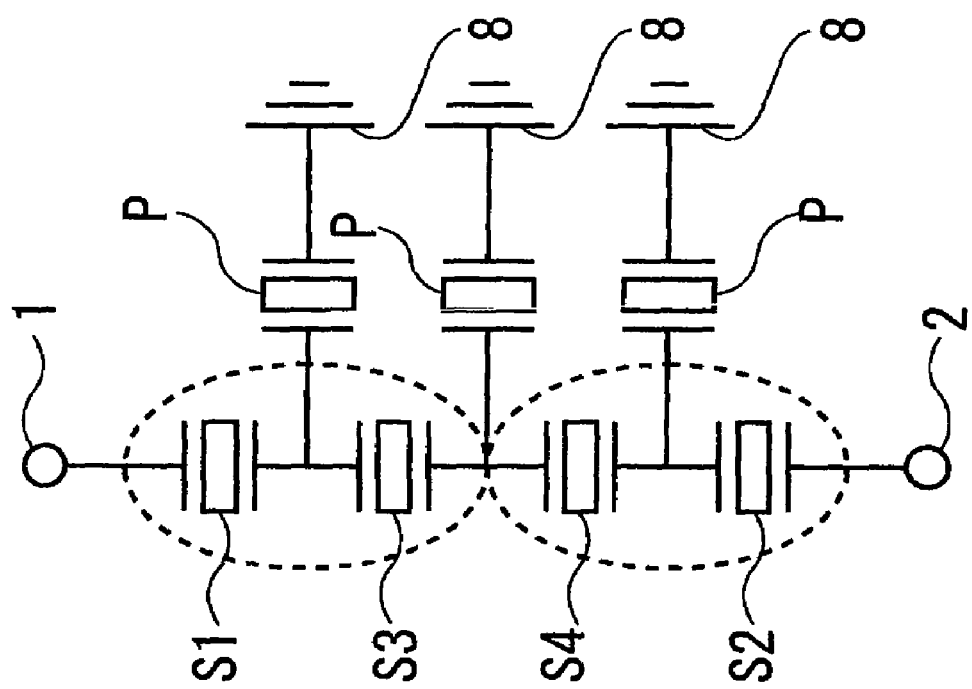
FIG. 10 is a diagram showing an equivalent circuit of the filter device shown in FIG. 9.

FIG. 1 is a diagram showing one example of configurations of a filter device according to a first embodiment of the present invention. FIG. 2 is a cross-sectional view illustrating a piezo-resonator making up the filter device shown in FIG. 1. FIG. 3 is a diagram showing an equivalent circuit of the filter device shown in FIG. 1. FIG. 4 is a graph showing a frequency characteristic of the filter device shown in FIG. 1. FIG. 5 is a diagram schematically showing another example of the configurations of the filter device according to the first embodiment. FIG. 6 is a diagram showing an equivalent circuit of the filter device shown in FIG. 5. FIG. 7 is a diagram schematically showing still another example of the configurations of the filter device according to the first embodiment. FIG. 8 is a diagram showing an equivalent circuit of the filter device shown in FIG. 7. FIG. 9 is a diagram schematically showing still another example of the configurations of the filter device of the first embodiment. FIG. 10 is a diagram showing an equivalent circuit of the filter device shown in FIG. 9.

The filter device of the first embodiment is made up of a piezo-resonator and, as shown in FIG. 1, an input signal electrode 1 and an output signal electrode 2 are formed. Between the input signal electrode 1 and the output signal electrode 2 are connected a first signal-side resonator S1 and a second signal-side resonator S2.

The first signal-side resonator S1 is made up of a first piezoelectric film 3, an input electrode film 4 connected to the input signal electrode 1, and a common electrode film 5 being commonly used by the second signal-side resonator S2 and the first piezoelectric film 3 is sandwiched between the input electrode film 4 and the common electrode film 5. The first signal-side resonator S1 operates in a specified resonant frequency Fr1 and in a specified anti-resonant frequency Fa1.

The second signal-side resonator S2 is made up of a second piezoelectric film 6 formed on the first piezoelectric film 3 in a layer-stacking direction, an output electrode film 7 connected to the output signal electrode 2, and the common electrode film 5 described above and the second piezoelectric film 6 is sandwiched between the output electrode film 7 and the common electrode film 5. The second signal-side resonator S2 operates in a specified resonant frequency Fr2 and in a specified anti-resonant frequency Fa2 and is formed directly below the layer-stacking direction of the first signal-side resonator S1 and is acoustically coupled to the first signal-side resonator S1.

Moreover, in general, both the resonant frequency and anti-resonant frequency in which two or more signal-side resonators have the same value, however, they may have a different value, which can be applied to cases described below. This can be applied to the resonant frequency and anti-resonant frequency in which two or more ground-side resonators operate.

A ground-side resonator P is formed between the common electrode film 6 and a ground electrode 8. The ground-side resonator P operates in a specified resonant frequency Fr3 and in an anti-resonant frequency Fa3 being almost equal to the resonant frequency Fr1 in which the first signal-side resonator S1 operates and to the resonant frequency Fr2 in which the second signal-side resonator S2 operates.

Moreover, in FIG. 1, the ground-side resonator P is connected to the common electrode film 5, however, the ground-side resonator P may be connected to the input electrode film 4 or the output electrode film 7 being not used commonly by both the first signal-side resonator S1 and second signal-side resonator S2, that is, to non-common electrode film. The ground-side resonator P may be formed in two or more numbers. In this case, the ground-side resonator P is connected to the common electrode film 5 or non-common electrode film and the common electrode film 5 and the non-common electrode film being not connected by the ground-side resonator P is not connected to the ground electrode 8.

Also, any one of a piezo-resonator, piezoelectric thin-film resonator, or surface acoustic wave resonator can be used as a resonator having no layer-structure such as the ground-side resonator P shown in FIG. 1, and which can be applied to cases described below.

Moreover, the resonant frequency or anti-resonant frequency in which a resonator having no layer-structure operates is measured not in a state in which such the resonator exists individually but in a state in which all electrodes other than those to be measured in a layer-structured state are made open and the resonant frequency and anti-resonant frequency in which the resonator to be measured operates are measured as the resonant frequency and anti-resonant frequency in which one port resonator operates.

The configurations of the piezo-resonator are described by referring to FIG. 2.

The piezo-resonator shown in FIG. 2 is one being called a "SMR-type piezo-resonator", in which, on one side surface of a substrate 11 made from silicon or glass is formed a ¼λ reflection film 26 in which a film made of a material having a high acoustic impedance and a film made of a material having a low acoustic impedance are alternately stacked, for example, an $SiO_2$ (silicon oxide) film 26a and an AlN (aluminum nitride) film 26b are alternately stacked, and on the reflection film 26 is formed an electrode film 24 and an electrode film 25 in layers in a manner in which a piezoelectric film 23 made from AlN or ZnO (zinc oxide) is sandwiched between the electrode film 24 and electrode film 25. Also, between the piezoelectric film 23 and the electrode film 25 is formed a dielectric film 27 made up of the $SiO_2$ film or a like. Then, on the electrode film 25 are further stacked a piezoelectric film, dielectric film, and electrode film to form two resonators (first signal-side resonator S1 and second signal-side resonator S2) shown in FIG. 1. Each of a thickness of the electrode film and a thickness of the piezoelectric film may be different depending on each resonator.

In FIG. 1, by applying a specified voltage to the input electrode film 4 and the common electrode film 5 in the first signal-side resonator S1, a bulk wave having a specified wavelength excited by the first piezoelectric film 3 propagates to the second signal-side resonator S2 being acoustically connected to the first signal-side resonator S1 and, therefore, these components when being connected between the input signal electrode 1 and the output signal electrode 2 operate as a filter.

FIG. 3 shows an equivalent circuit of the filter device having configurations described above and FIG. 4 shows a frequency characteristic of the filter device shown in FIG. 1. As shown in FIG. 3, the filter device of the embodiment has the same electrical configurations as a conventional ladder-type filter device. Therefore, as shown in FIG. 4, the filter device of the embodiment has, as in the case of the conventional ladder-type filter device, a frequency characteristic that allows the filter device to operate in a wide frequency band. In FIG. 3, portions shown by dotted lines correspond to the portion constructed of the piezo-resonator, which is applied to cases described below.

In the filter device having the configurations as described above, since the first signal-side resonator S1 and the second signal-side resonator S2, both being a piezo-resonator, are acoustically connected to each other and the ground-side resonator P is connected between the common electrode film 5 and the ground electrode 8, an area occupied by the resonator is reduced and, therefore, the filter device can be made smaller in size when compared with the case of the conventional ladder-type filter device in which components are arranged so as to be able to avoid interference. Also, by employing the layer-stacked structure, connecting paths being electrically connected to one another can be shortened and, as a result, the filter device can be made low in power loss. Moreover, as shown in FIG. 4, the filter device of the embodiment has a wide band characteristic being equal to that of the conventional ladder-type filter device.

Thus, the filter device of the embodiment being low in power loss and small in size, and being able to operate in a wide frequency band can be obtained.

Another example of configurations of the filter device of the embodiment is shown in FIG. 5 and a diagram of an equivalent circuit of the filter device shown in FIG. 6 is shown in FIG. 6.

As shown in FIG. 5, between a first piezoelectric film 3 and a second piezoelectric film 6 is formed a third piezoelectric film 9 and between the third piezoelectric film 9 and the second piezoelectric film 6 is formed a second common electrode film 10 being commonly used by the second signal-side resonator S2. The third piezoelectric film 9 and two common electrode films 5 and 10 make up a third signal-side resonator S3 which operates in a specified resonant frequency Fr4 and in a specified anti-resonant frequency Fa4 and which is acoustically connected to the first signal-side resonator S1 and the second signal-resonator S2.

Also, between the common electrode film 10 and a ground electrode 8 is connected a ground-side resonator P which operates in a specified resonant frequency Fr5 and in an anti-resonant frequency Fa5 almost conforming to the resonant frequencies Fr1, Fr2, and Fr4.

In the embodiment shown in FIG. 5, only one third signal-side resonator S3 is formed between the first signal-side resonator S1 and the second signal-side resonator S2, however, two or more third signal-side resonator may be formed S3.

In the filter device having the configurations shown in FIG. 5, an area occupied by the resonator can be reduced more compared with the case of the conventional ladder-type filter device, which enables the filter device to be small in size, and by employing the layer-stacked structure, connecting paths being electrically connected to one another can be shortened, which enables the filter device to be low in power loss. Furthermore, the filter device of the embodiment can have a wide frequency band characteristic being equal to that of the conventional ladder-type filter device. Thus, according to the example shown in FIG. 5, the filter device of the embodiment also is low in power loss and small in size, and can operate in a wide frequency band.

Still another example of the configurations of the filter device of the embodiment is shown in FIG. 7 and a diagram of an equivalent circuit of the filter device shown in FIG. 6 is shown in FIG. 8.

The filter device shown in FIG. 7 is one achieved by substantially connecting the filter device shown in FIG. 1 in a two-stage state. A first signal-side resonator S1 is made up of a first piezoelectric film 3, an input electrode film 4, and a common electrode film 5 being commonly used by a third signal-side resonator S3 and sandwiching a first piezoelectric film 3 using the input electrode film 4. Also, a second signal-side resonator S2 is made up of the first piezoelectric film 3, an output electrode film 7, and a common electrode film 10 being commonly used by a fourth signal-side resonator S4 and sandwiching the first piezoelectric film 3 using the output electrode film 7. Furthermore, the third signal-side resonator S3 is made up of a second piezoelectric film 6, the common electrode film 5, and an intermediate electrode film 12 being connected to an intermediate electrode film 13 in the fourth signal-side resonator S4 and sandwiching the second piezoelectric film 6 using the common electrode film 5, and is acoustically coupled to the first signal-side resonator S1. The fourth signal-side resonator S4 is made up of the second piezoelectric film 6, the common electrode film 10, and an intermediate electrode film 13 being connected to the intermediate electrode film 12 and sandwiching the second piezoelectric film 6 using the common electrode film 10, and is acoustically coupled to the second signal-side resonator S2.

Between the common electrode film 5 and a ground electrode 8 is connected a ground-side resonator P, and between the common electrode film 10 and the ground electrode 8 is connected another ground-side resonator P.

In FIG. 7, the intermediate electrode film 12 and intermediate electrode film 13 are connected to each other via a conductor path 14, however, they may be integrally formed.

According to the configurations of the filter device described above, by using an area corresponding to about four pieces of resonators, the same characteristic as obtained by two-dimensionally arranged six pieces of resonators can be realized, which enables the filter device to be small in size, and by employing the layer-structure, connecting paths being electrically connected to one another can be shortened, which enables the filter device to be low in power loss. Also, the filter device of the embodiment can provide a wide frequency band characteristic being equal to that of the conventional ladder-type filter device. Thus, the filter device can be made low in power loss and small in size, and can operate in a wide frequency band.

Moreover, by connecting the ground-side resonator P between the intermediate electrode films 12 and 13 as shown in FIGS. 9 and 10, the same effects as above can be realized.

Second Embodiment

Figure 11:
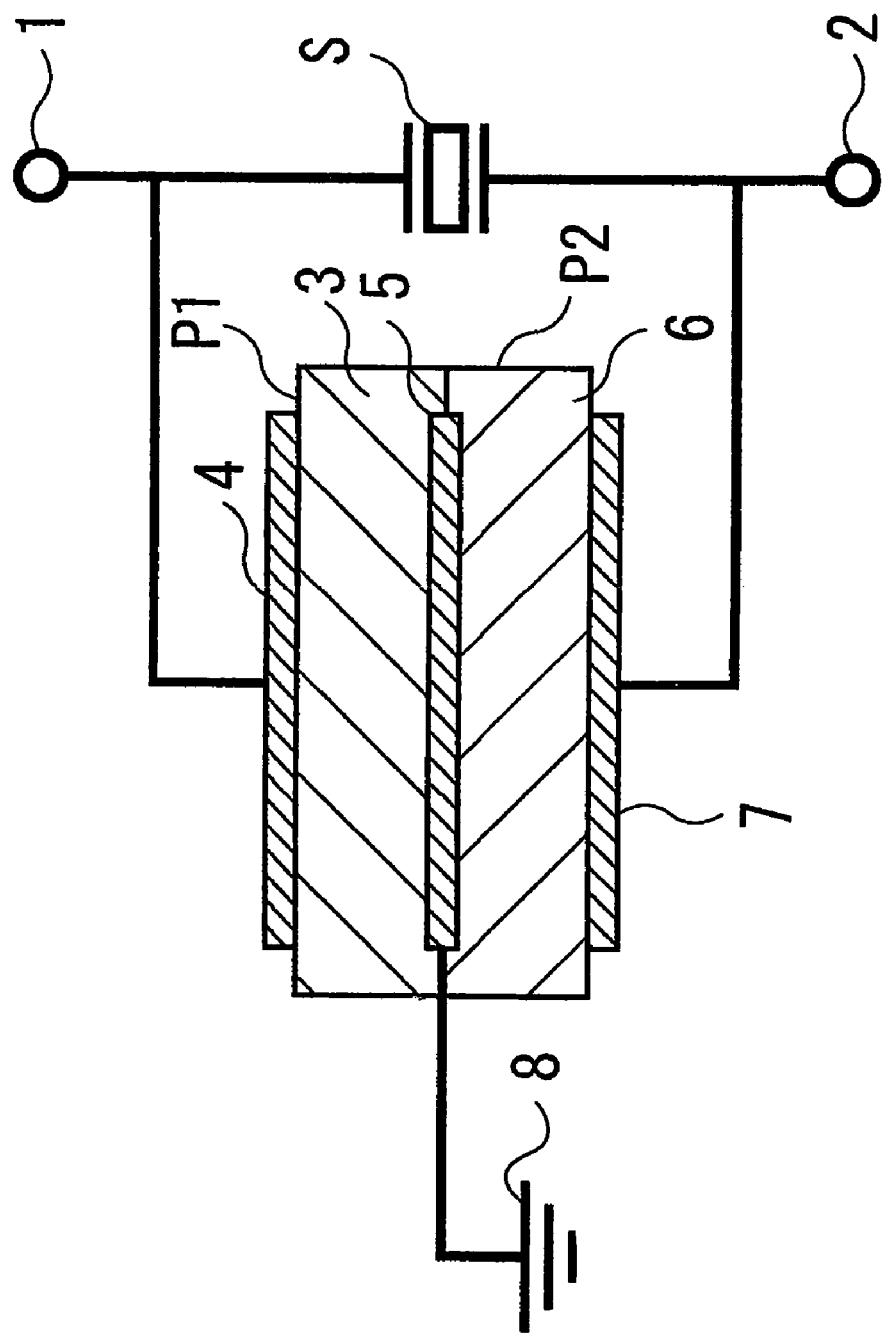
FIG. 11 is a diagram schematically showing one example of configurations of a filter device according to a second embodiment of the present invention.
Figure 12:
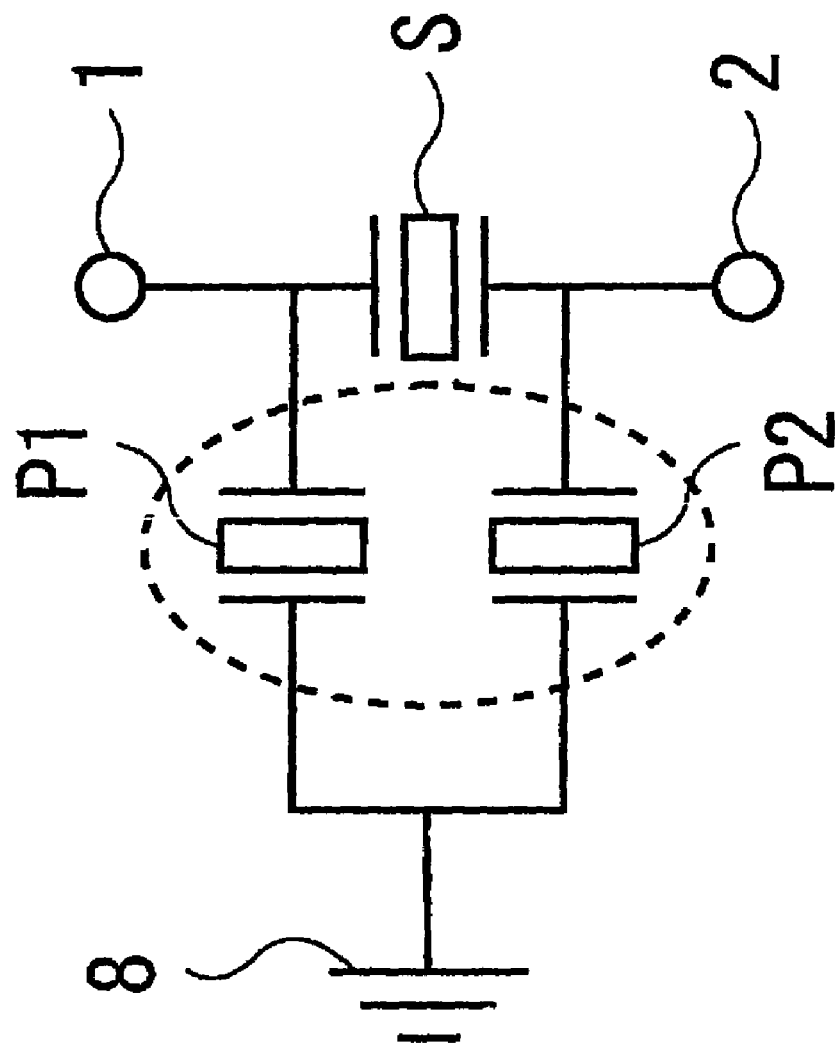
FIG. 12 is a diagram showing an equivalent circuit of the filter device shown in FIG. 11.
Figure 13:
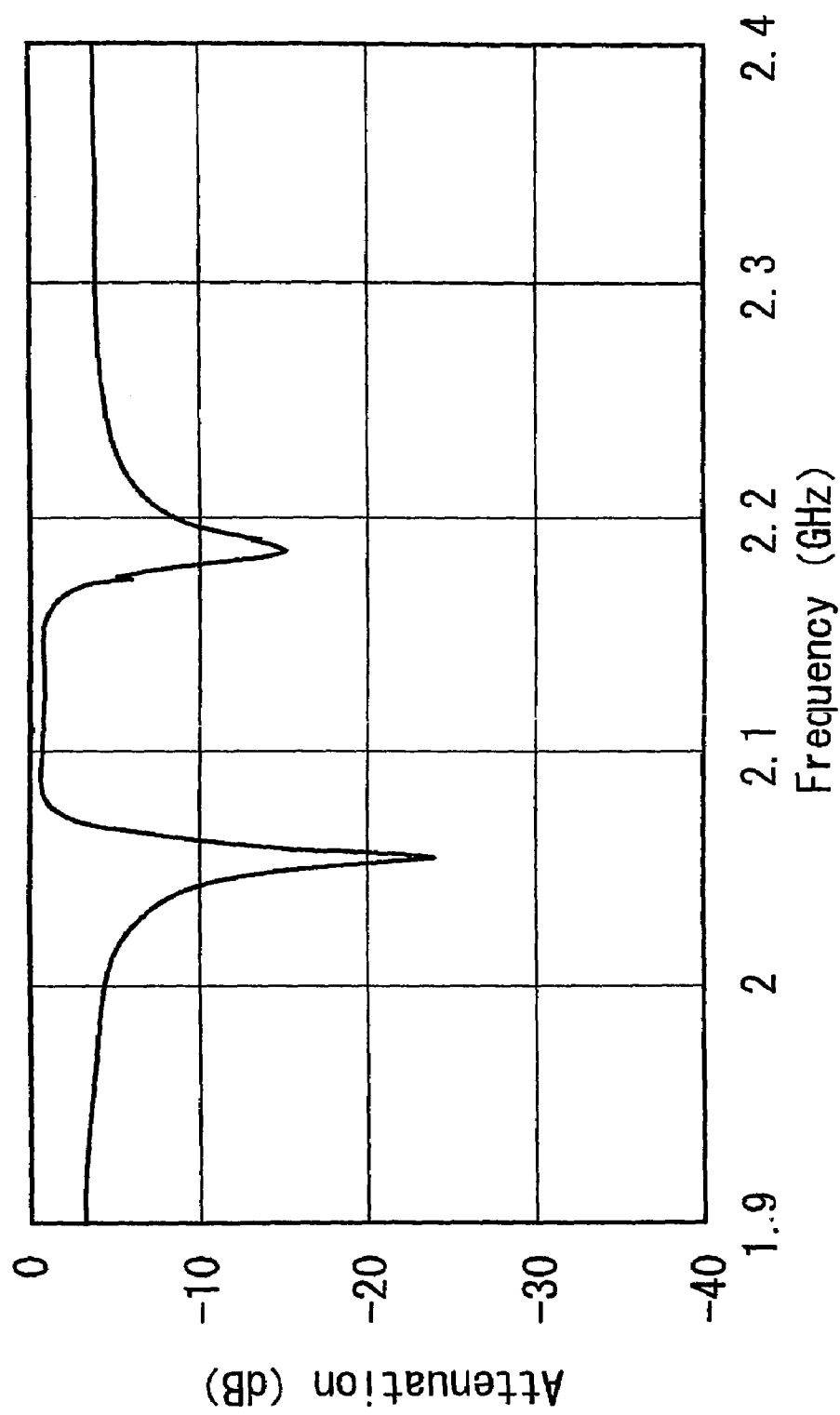
FIG. 13 is a graph showing a frequency characteristic of the filter device shown in FIG. 11.
Figure 14:
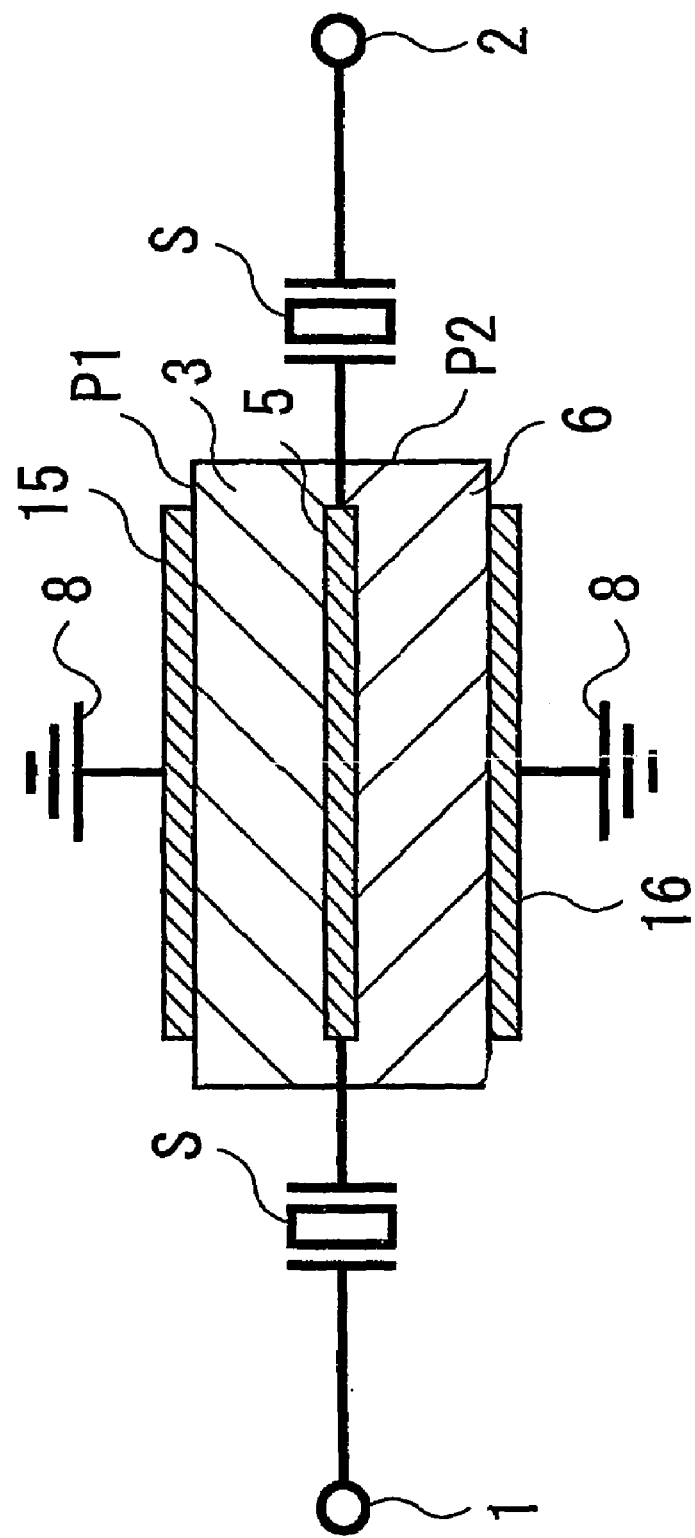
FIG. 14 is a diagram schematically showing another example of the configurations of the filter device according to the second embodiment of the present invention.
Figure 15:
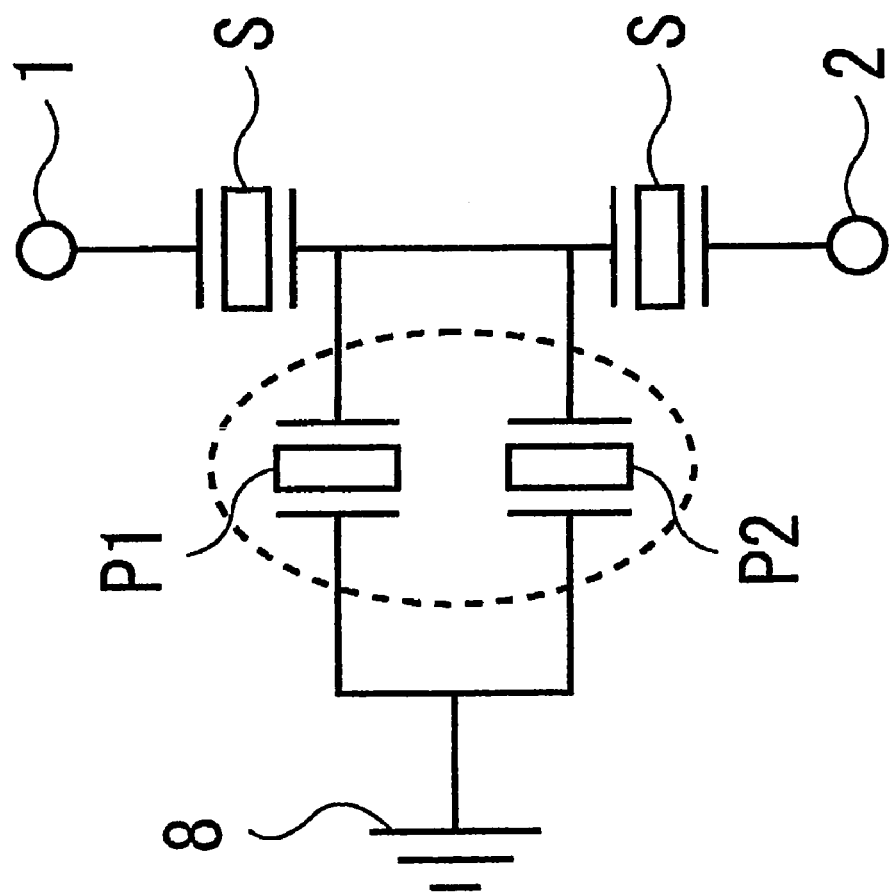
FIG. 15 is a diagram showing an equivalent circuit of the filter device shown in FIG. 14.
Figure 16:
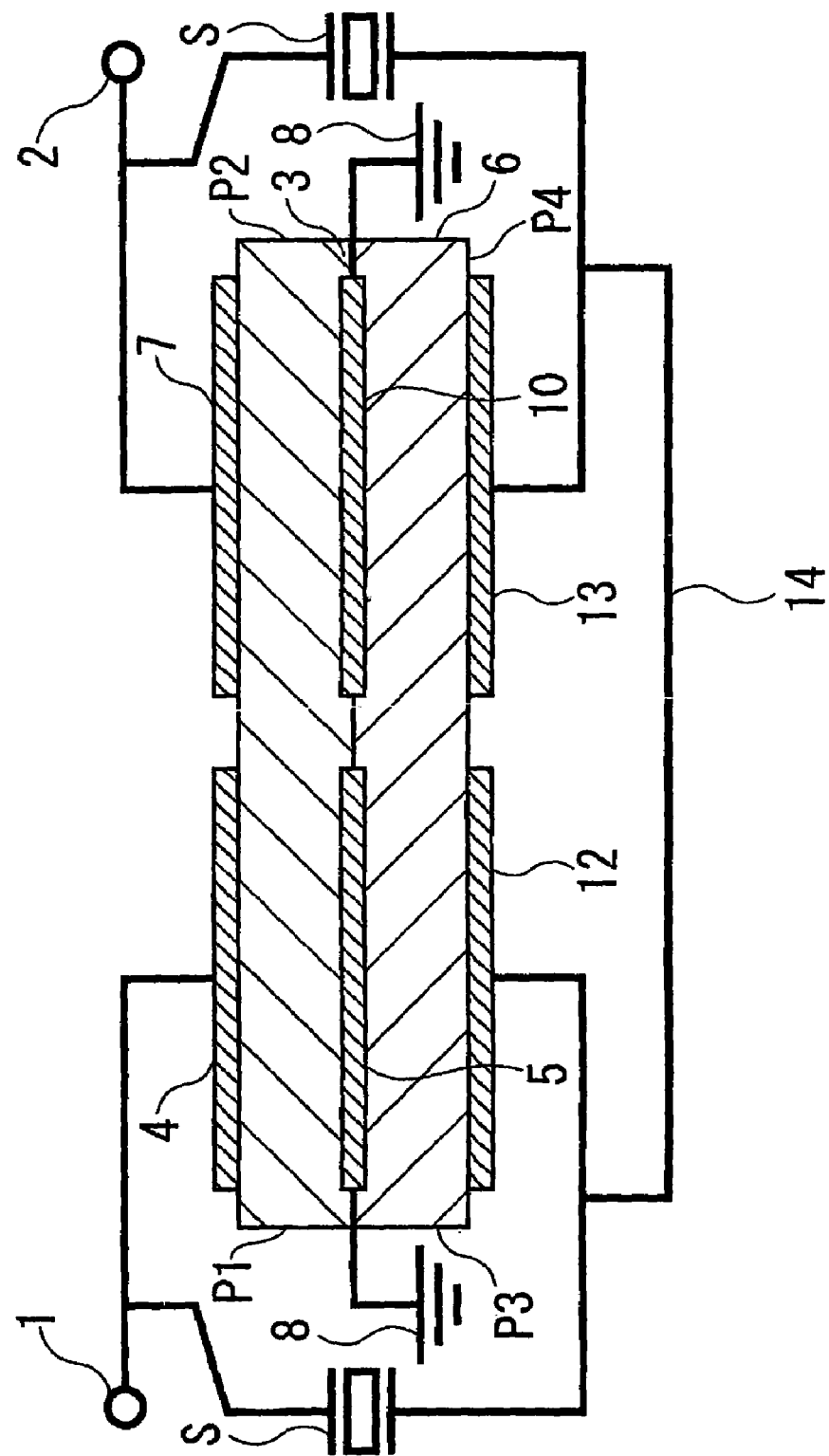
FIG. 16 is a diagram schematically showing still another example of the configurations of the filter device according to the second embodiment of the present invention.
Figure 17:
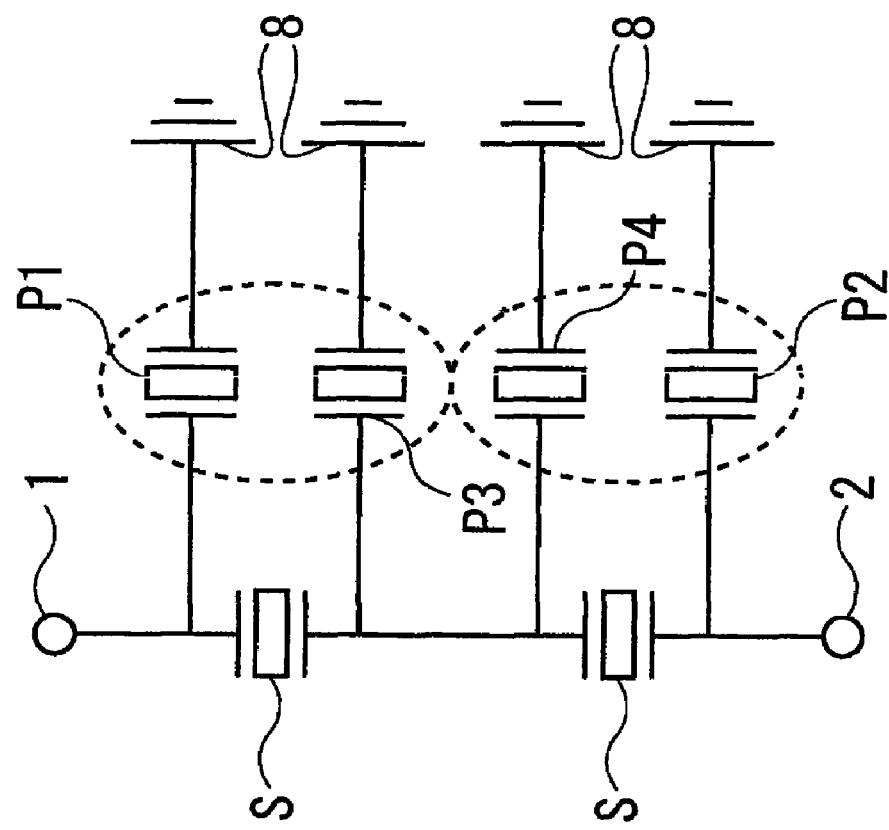
FIG. 17 is a diagram showing an equivalent circuit of the filter device shown in FIG. 16.
Figure 18:
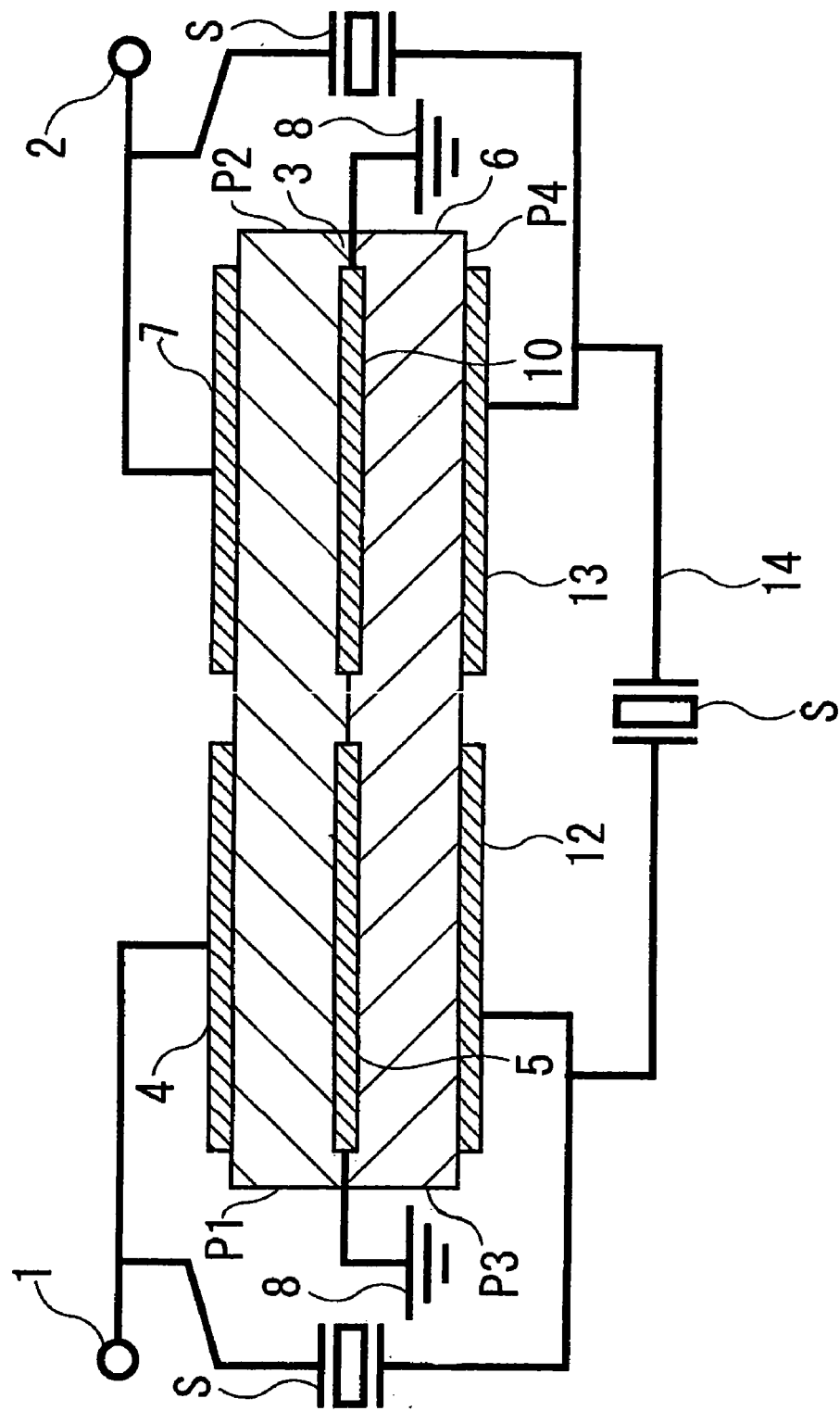
FIG. 18 is a diagram schematically showing still another example of the configurations of the filter device according to the second embodiment of the present invention.
Figure 19:
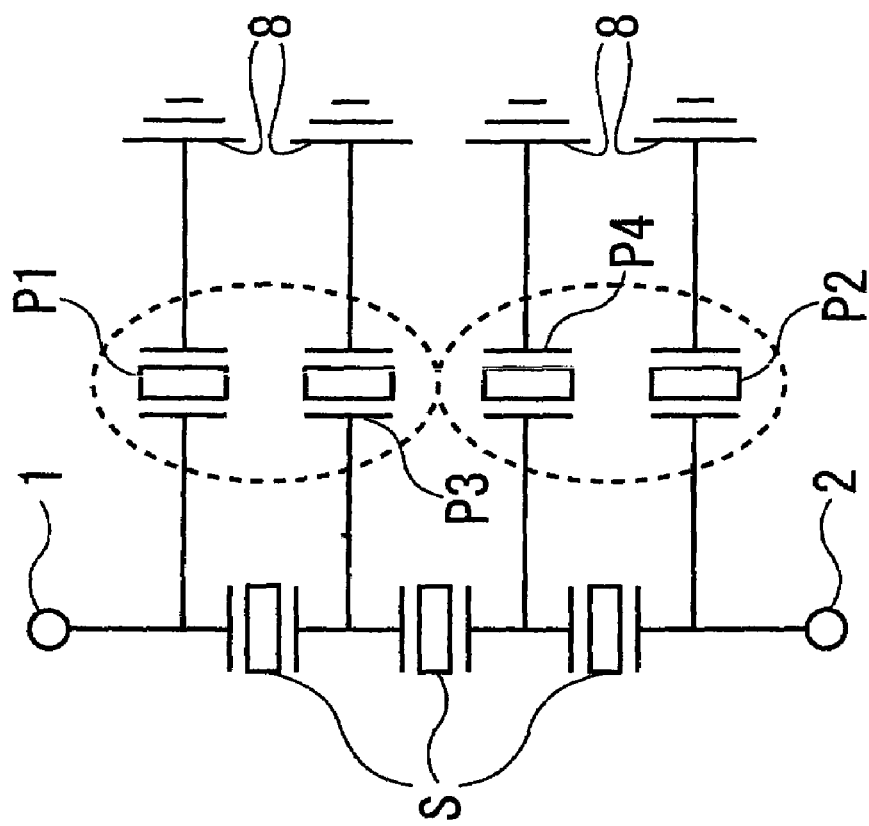
FIG. 19 is a diagram showing an equivalent circuit of the filter device shown in FIG. 18.

FIG. 11 is a diagram showing one example of configurations of a filter device according to a second embodiment of the present invention. FIG. 12 is a diagram showing an equivalent circuit of the filter device shown in FIG. 11. FIG. 13 is a graph showing a frequent characteristic of the filter device shown in FIG. 11. FIG. 14 is a diagram showing another example of configurations of the filter device according to the second embodiment. FIG. 15 is a diagram showing an equivalent circuit of the filter device shown in FIG. 14. FIG. 16 is a diagram showing still another example of configurations of the filter device according to the second embodiment. FIG. 17 is a diagram showing an equivalent circuit of the filter device shown in FIG. 16. FIG. 18 is a diagram showing still another example of configurations of the filter device according to the second embodiment. FIG. 19 is a diagram showing an equivalent circuit of the filter device shown in FIG. 18.

As shown in FIG. 11, in the filter device of the second embodiment, between an input signal electrode 1 and an output signal electrode 2 is connected a signal-side resonator S which operates in a specified resonant frequency Fr1 and in a specified anti-resonant frequency Fa1. Between the input signal electrode 1 and a ground electrode 8 is formed a first ground-side resonator P1 and between the output signal electrode 2 and the ground electrode 8 is formed a second ground-side resonator P2.

The first ground-side resonator P1 is made up of a first piezoelectric film 3, an input electrode film 4 connected to the input signal electrode 1, and a common electrode film 5 being commonly used by the second ground-side resonator P2 and being connected to the ground electrode 8, in which the first piezoelectric film 3 is sandwiched between the input electrode film 4 and the common electrode film 5. The first ground-side resonator P1 operates in a specified resonant frequency Fr2 and in an anti-resonant frequency Fa2 almost conforming to a resonant frequency in which the signal-side resonator S operates.

Also, the second ground-side resonator P2 is made up of a second piezoelectric film 6 formed on the first piezoelectric film 3 in a layer-stacking direction, an output electrode film 7 connected to the output signal electrode 2, and the common electrode film 5, in which the second piezoelectric film 6 is sandwiched between the output electrode film 7 and the common electrode film 5. The second ground-side resonator P2 operates in a specified resonant frequency Fr3 and in an anti-resonant frequency Fa3 almost conforming to a resonant frequency in which the signal-side resonator S operates. The second ground-side resonator P2 is formed directly below the layer-stacking direction in the first ground-side resonator P1 and is acoustically coupled to the first ground-side resonator P1.

Moreover, the signal-side resonator S is connected between the input electrode film 4 being an electrode film, in the first ground-side resonator P1, being not used commonly by the second ground-side resonator P2, that is, a non-common electrode film and the output electrode film 7 being an electrode film, in the second ground-side resonator P2, being not used commonly by the first ground-side resonator P1, that is, a non-common electrode film. The common electrode film 5 is connected to the ground electrode 8.

As the signal-side resonator S, a piezoelectric resonator, piezoelectric thin-film resonator, surface acoustic wave resonator, or a like can be used. In this case, the signal-side resonator S may be constructed in a manner in which the common electrode film 5 formed in the same layer as the first ground-side resonator P1 or the second ground-side resonator P2 is contained.

Furthermore, by forming piezoelectric films between the first piezoelectric film 3 and the second piezoelectric film 6, one ground-side resonator or two or more ground-side resonators may be additionally formed between the first ground-side resonator P1 and the second ground-side resonator P2.

An equivalent circuit of the filter device having the configurations described above is shown in FIG. 12 and a frequency characteristic of the filter device is shown in FIG. 13. The filter device of the second embodiment as shown in FIG. 12 has also electrically same configuration as the conventional ladder-type filter device has. Therefore, as shown in FIG. 13, the filter device of the second embodiment has, as in the case of the conventional ladder-type filter device, a frequency characteristic that allows the filter device to operate in a wide frequency band.

In the filter device having such the configurations as above, between the input signal electrode 1 and the output signal electrode 2 is connected the signal-side resonator S and between the input signal electrode 1 and the ground electrode 8 is formed the first ground-side resonator P1 and between the output signal electrode 2 and the ground electrode 8 is formed the second ground-side resonator P2 being acoustically coupled to the first ground-side resonator P1 and, therefore, an area occupied by the resonator is reduced, which enables the filter device to be smaller in size when compared with the case of the conventional ladder-type filter device in which components are arranged so as to be able to avoid interference, and by employing the layer-stacked structure, connecting paths being electrically connected to one another can be shortened, which enables the filter device to be low in power loss. Moreover, as shown in FIG. 13, the filter device of the second embodiment can have a wide band characteristic being equal to that of the conventional ladder-type filter device.

Therefore, according to the filter device of the second embodiment, the filter device which is low in power loss and small in size and which can operate in a wide frequency band can be obtained.

Another example of configurations of the filter device of the second embodiment is shown in FIG. 14 and a diagram showing an equivalent circuit of the filter device is shown in FIG. 15.

As shown in FIG. 14, between an input signal electrode 1 and an output signal electrode 2 are connected two signal-side resonators S and S. Between the signal-side resonators S and S is connected a common electrode film 5 being commonly used by a first ground-side resonator P1 and a second ground-side resonator P2.

The first ground-side resonator P1 has a first piezoelectric film 3, a first ground electrode film 15 connected to a ground electrode 8, and the common electrode film 5 sandwiching the first piezoelectric film 3 using the first ground electrode film 15. The second ground-side resonator P2 has a second piezoelectric film 6, a second ground electrode film 16 connected to the ground electrode 8, the common electrode film 5 sandwiching the second piezoelectric film 6 using the second ground electrode film 16, and is acoustically coupled to the first ground-side resonator P1.

According to the configurations of the filter device as above, by using an area corresponding to about three pieces of resonators, the same characteristic as obtained by two-dimensionally arranged four pieces of resonators can be realized and, therefore, an area occupied by the resonator is reduced more compared with the case of the conventional ladder-type filter device, which enables the filter device to be small in size. Also, by employing the layer-stacked structure, connecting paths being electrically connected to one another can be shortened, which enables the filter device to be low in power loss, and a wide frequency band characteristic being equal to that of the conventional ladder-type filter device is obtained, which enables the filter device to be low in power loss and small in size and to be operated in a wide frequency band.

Still another example of the configurations of the filter device of the second embodiment is shown in FIG. 16 and a diagram showing an equivalent circuit of the filter device is shown in FIG. 17.

The filter device shown in FIG. 16 is one achieved by substantially connecting the filter device shown in FIG. 11 in a two-stage state. The filter device of the second embodiment shown in FIG. 16 also has two signal-side resonators S and S being connected between an input signal electrode 1 and an output signal electrode 2.

A first ground-side resonator P1 is made up of a first piezoelectric film 3, an input electrode film 4, and a common electrode film 5 being commonly used by a third ground-side resonator P3 and being connected to a ground electrode 8 and sandwiching the first piezoelectric film 3 using the input electrode film 4. A second ground-side resonator P2 is made up of the first piezoelectric film 3, an output electrode film 7, and a common electrode film 10 being commonly used by a fourth ground-side resonator P4 and being connected to the ground electrode 8 and sandwiching the first piezoelectric film 3 using the output electrode film 7. Also, a third ground-side resonator P3 is made up of a second piezoelectric film 6, the common electrode film 5, and an intermediate electrode film 12 being connected to an intermediate electrode film 13 of the fourth ground-side resonator P4 and sandwiching the second piezoelectric film 6 using the common electrode film 5, and is acoustically coupled to the first ground-side resonator P1. The fourth ground-side resonator P4 is made up of the second piezoelectric film 6, the common electrode film 10, and the intermediate electrode film 13 being connected to the intermediate electrode film 12 and sandwiching the second piezoelectric film 6 using the common electrode film 10, and is acoustically coupled to the second ground-side resonator P2.

In FIG. 16, both the intermediate electrode film 12 and intermediate electrode film 13 are connected to each other via a conductor path 14, however, they may be integrally formed.

According to the configurations of the filter device as above, by using an area corresponding about to four pieces of resonators, the same characteristic as obtained by two-dimensionally arranged six pieces of resonators can be realized and, therefore, an area occupied by the resonator is reduced more, which enables the filter device to be small in size. Also, by employing the layer-stacked structure, connecting paths being electrically connected to one another are shortened, which enables the filter device to be low in power loss, and a wide frequency band characteristic being equal to that of the conventional ladder-type filter device is obtained, which enables the filter device to be low in power loss and small in size and to be operated in a wide frequency band.

As shown in FIGS. 18 and 19, by connecting a signal-side resonator S between the intermediate electrode films 12 and 13, the same effects as obtained in the above embodiment can be realized.

Third Embodiment

Figure 20:
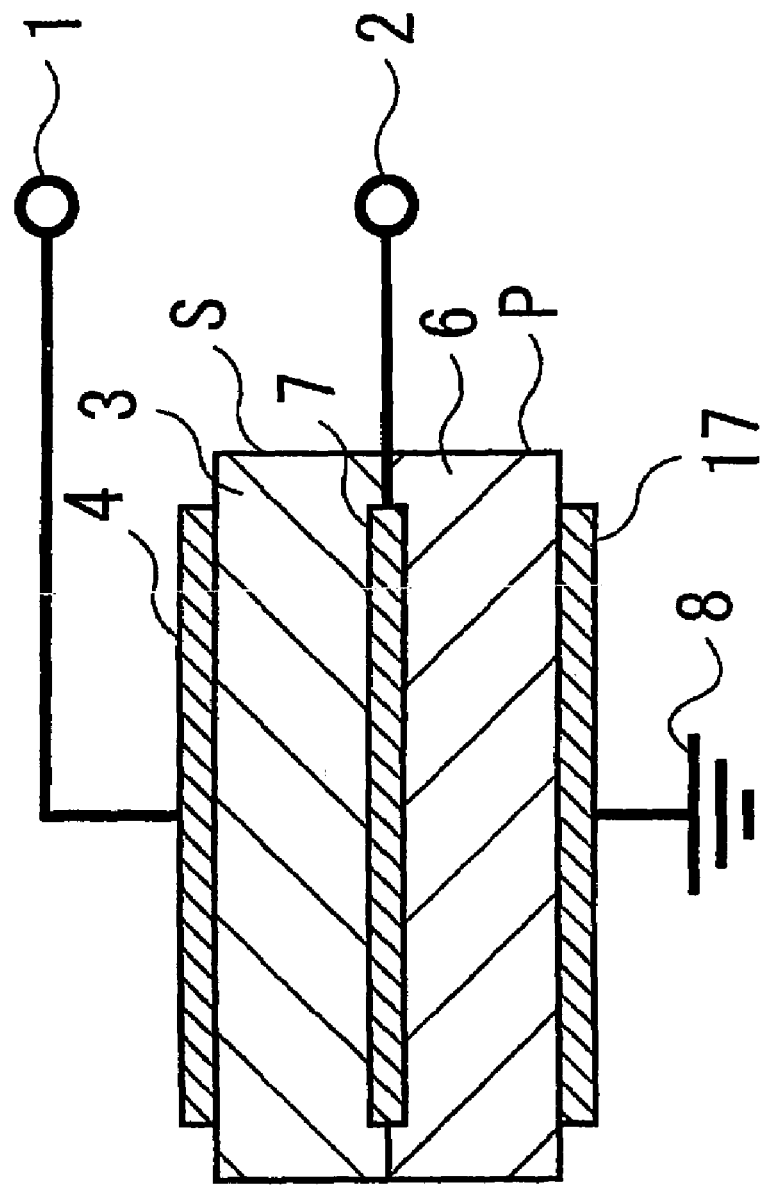
FIG. 20 is a diagram schematically showing one example of configurations of a filter device according to a third embodiment of the present invention.
Figure 21:
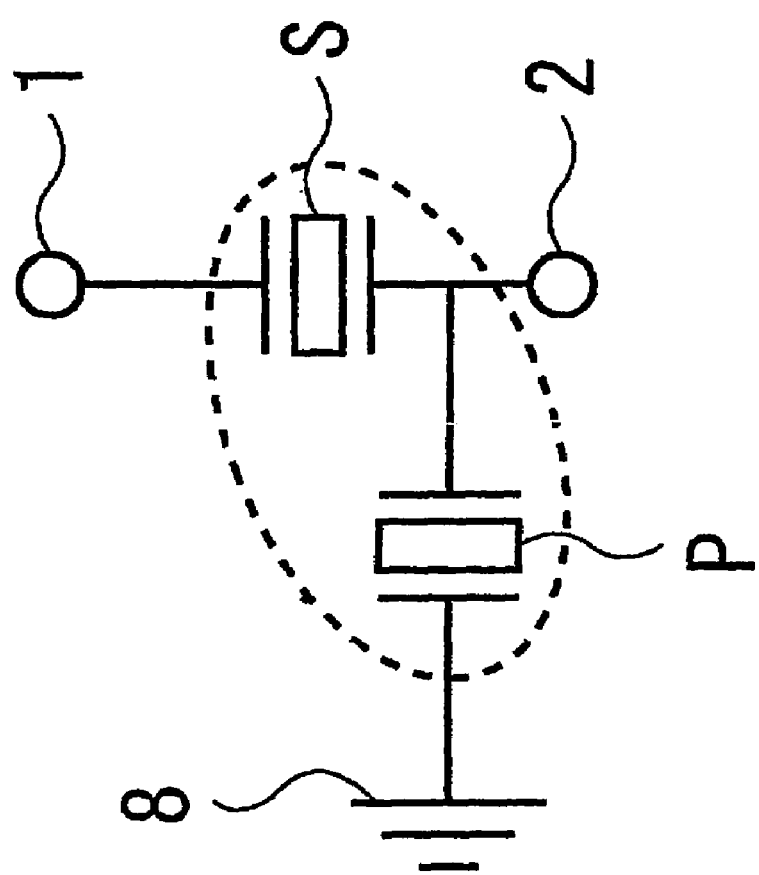
FIG. 21 is a diagram showing an equivalent circuit of the filter device shown in FIG. 20.
Figure 22:
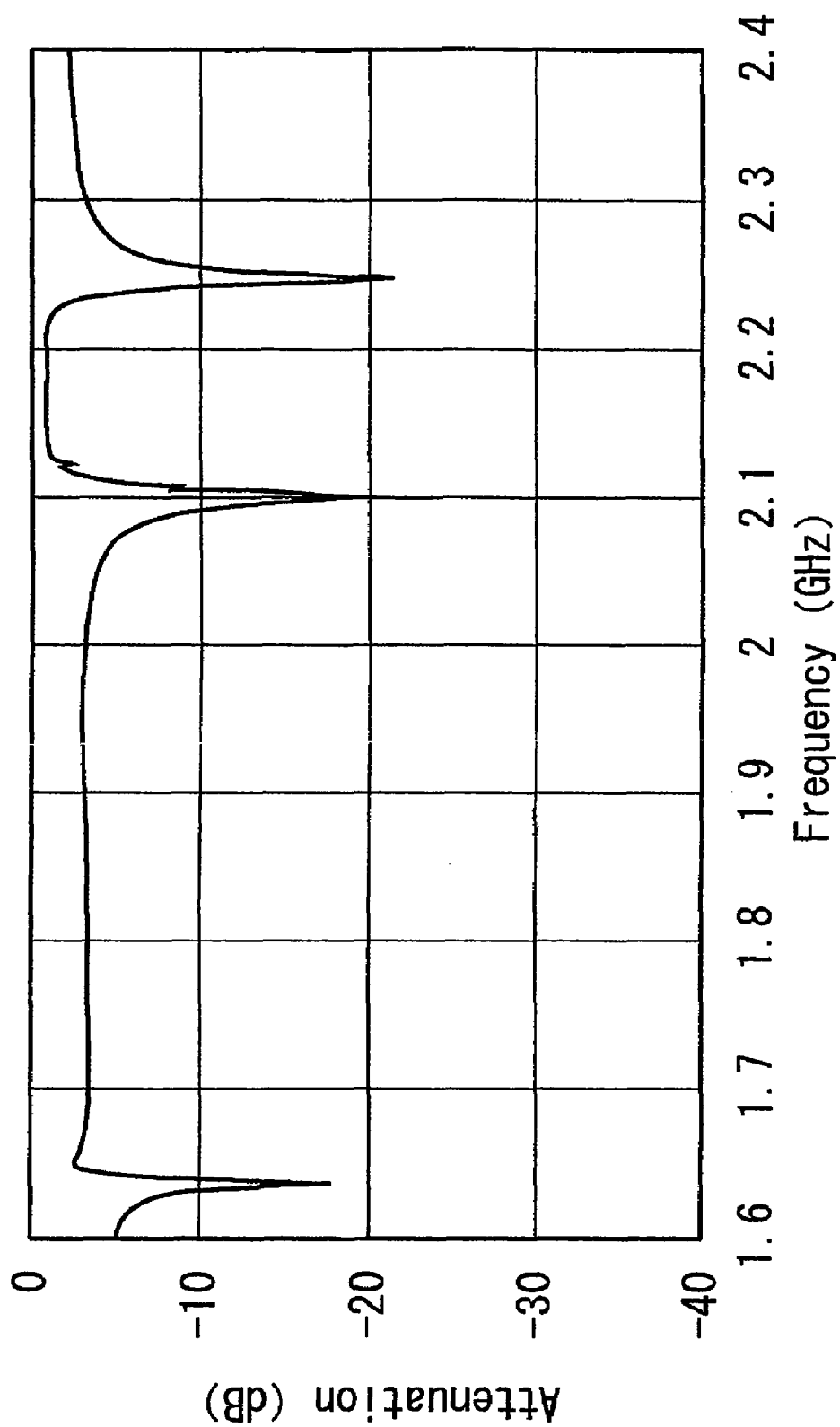
FIG. 22 is a graph showing a frequency characteristic of the filter device shown in FIG. 20.
Figure 23:
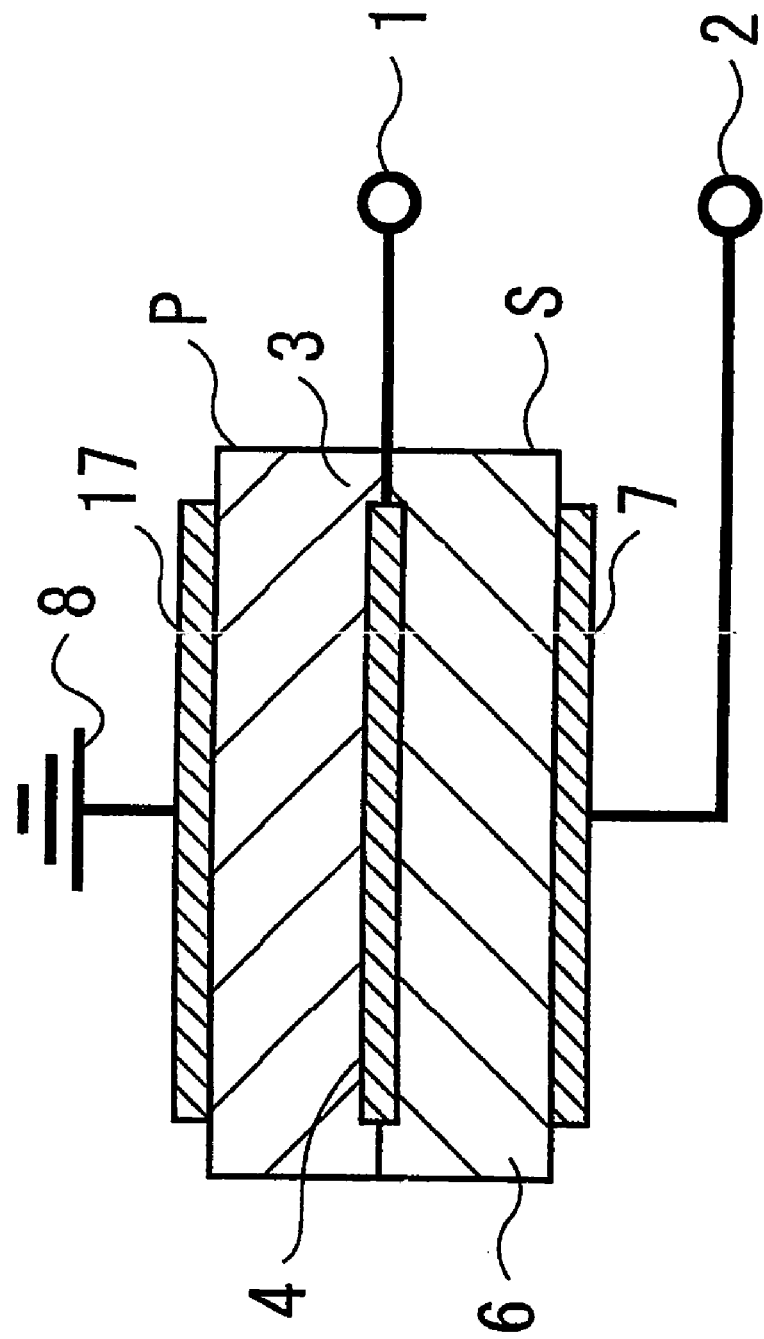
FIG. 23 is a diagram schematically show another example of the configurations of the filter device according to the third embodiment of the present invention.
Figure 24:
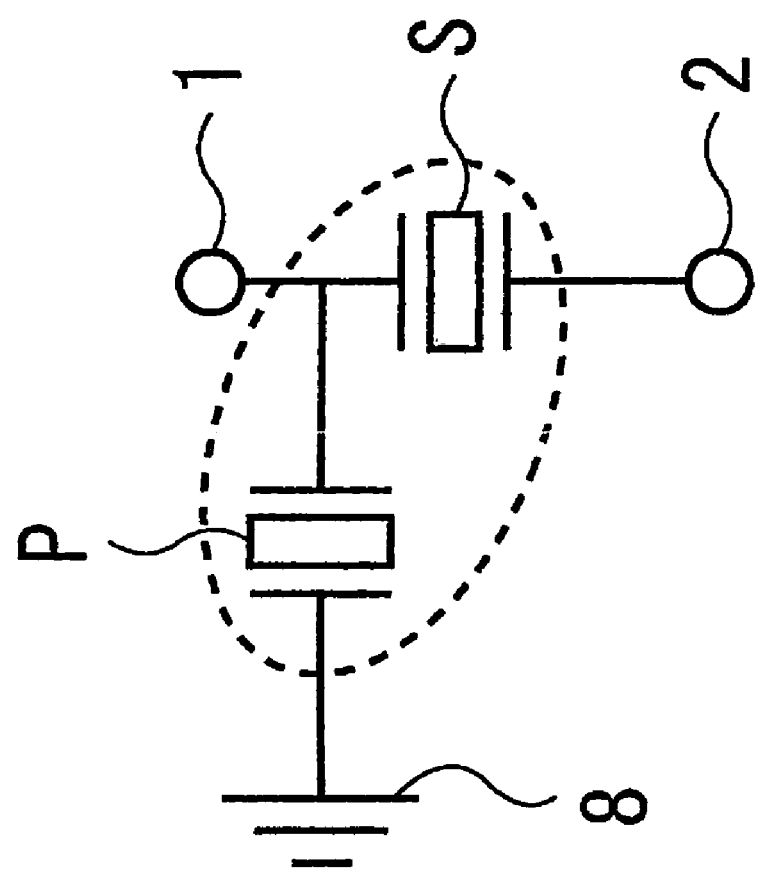
FIG. 24 is a diagram showing an equivalent circuit of the filter device shown in FIG. 23.
Figure 25:
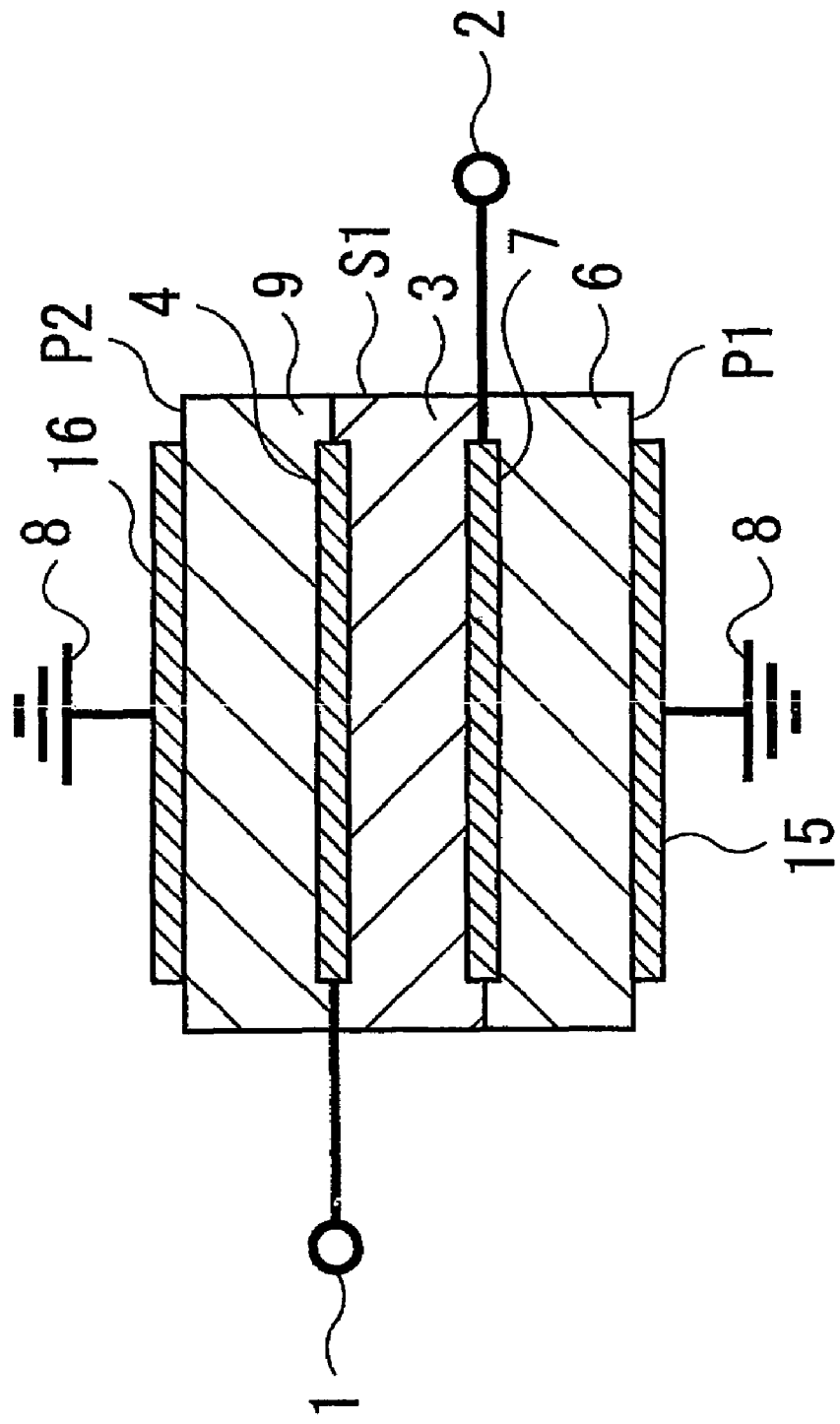
FIG. 25 is a diagram schematically showing still another example of the configurations of the filter device according to the third embodiment of the present invention.
Figure 26:
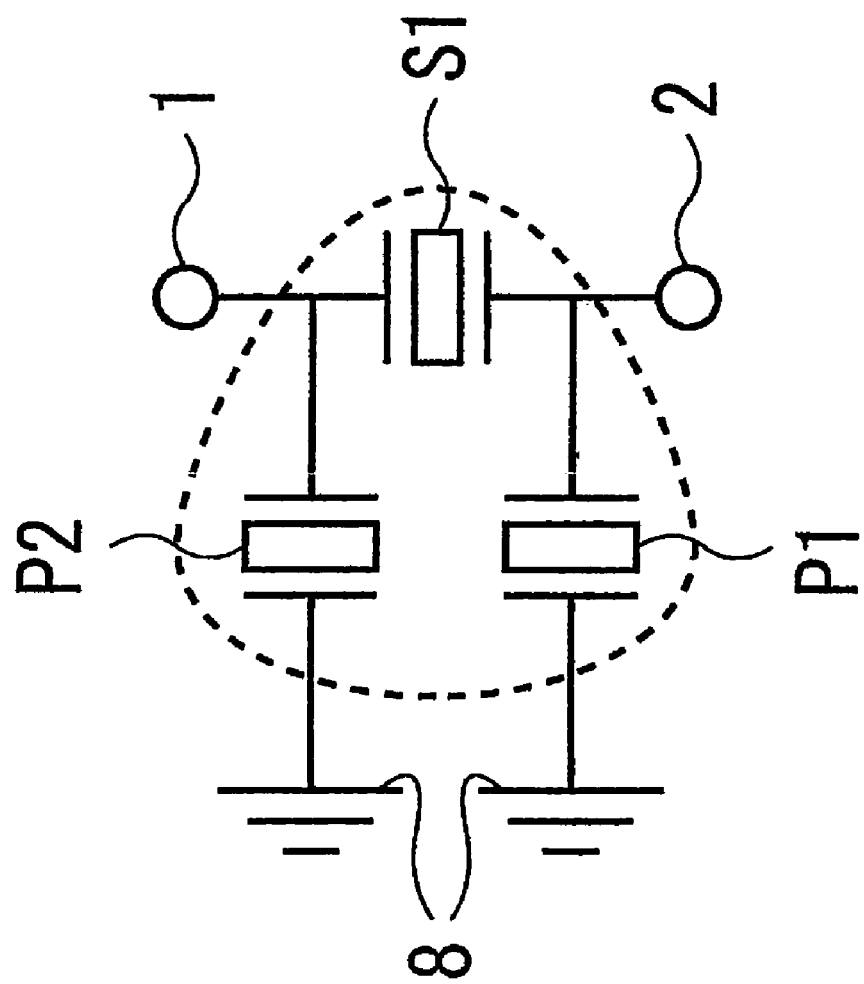
FIG. 26 is a diagram showing an equivalent circuit of the filter device shown in FIG. 25.
Figure 27:
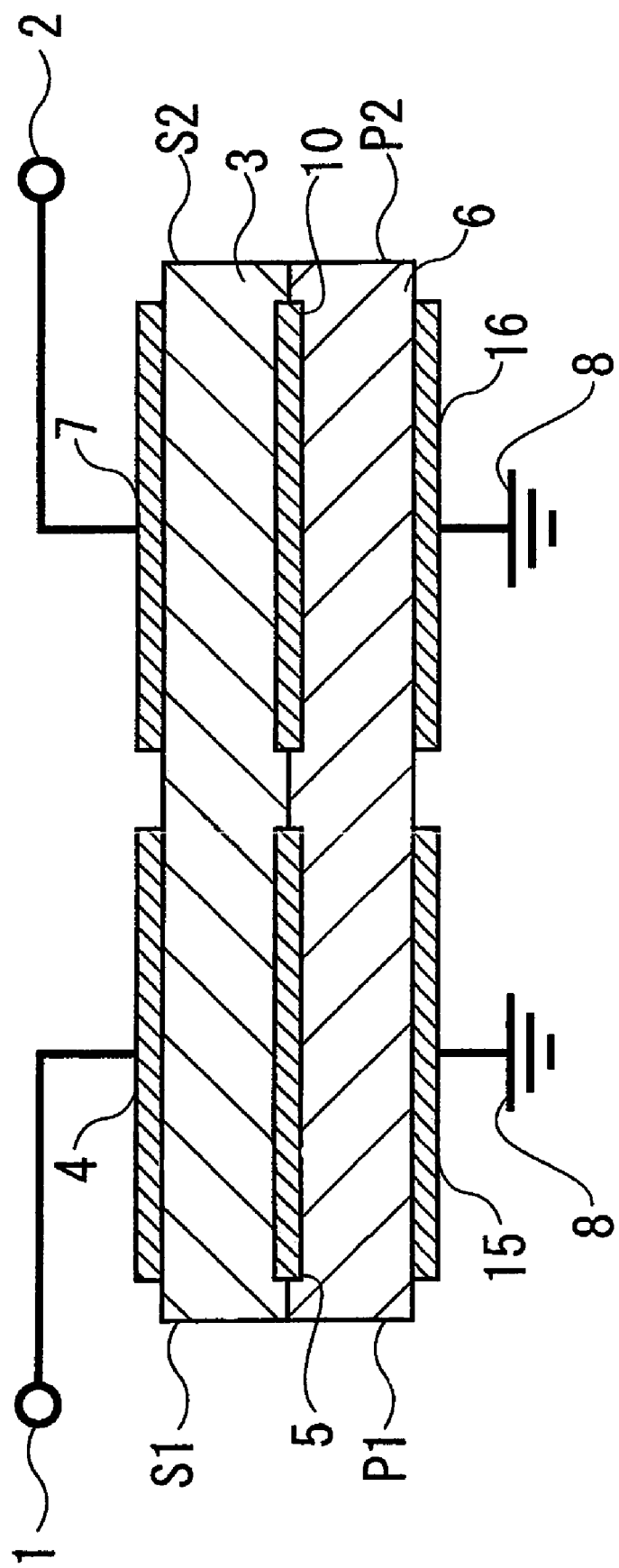
FIG. 27 is a diagram schematically showing still another example of the configurations of the filter device according to the third embodiment of the present invention.
Figure 28:
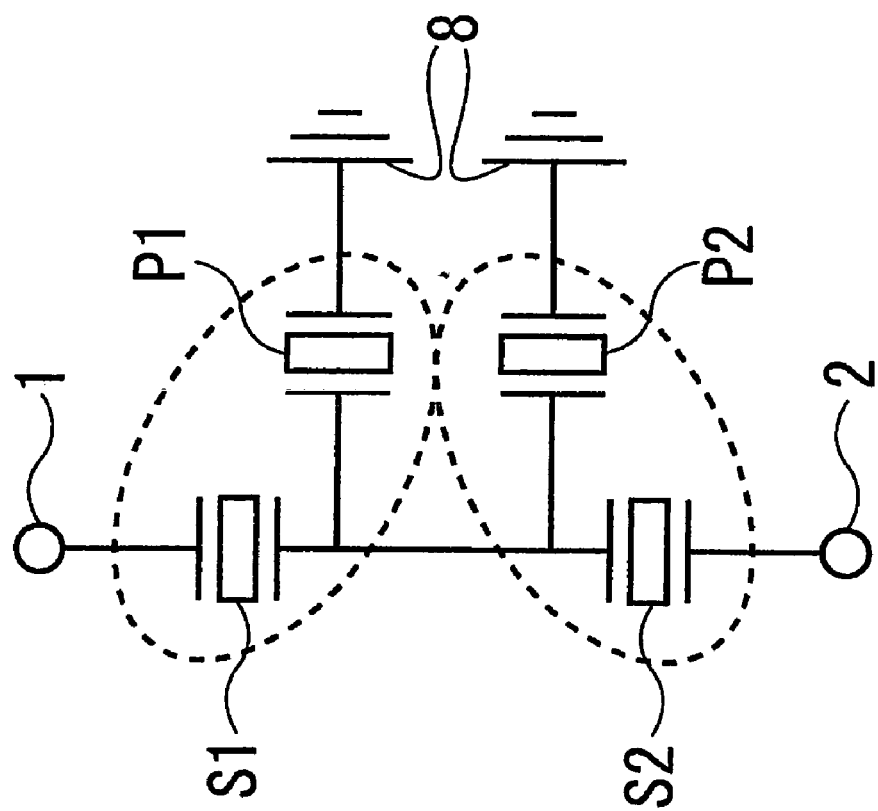
FIG. 28 is a diagram showing an equivalent circuit of the filter device shown in FIG. 27.
Figure 29:
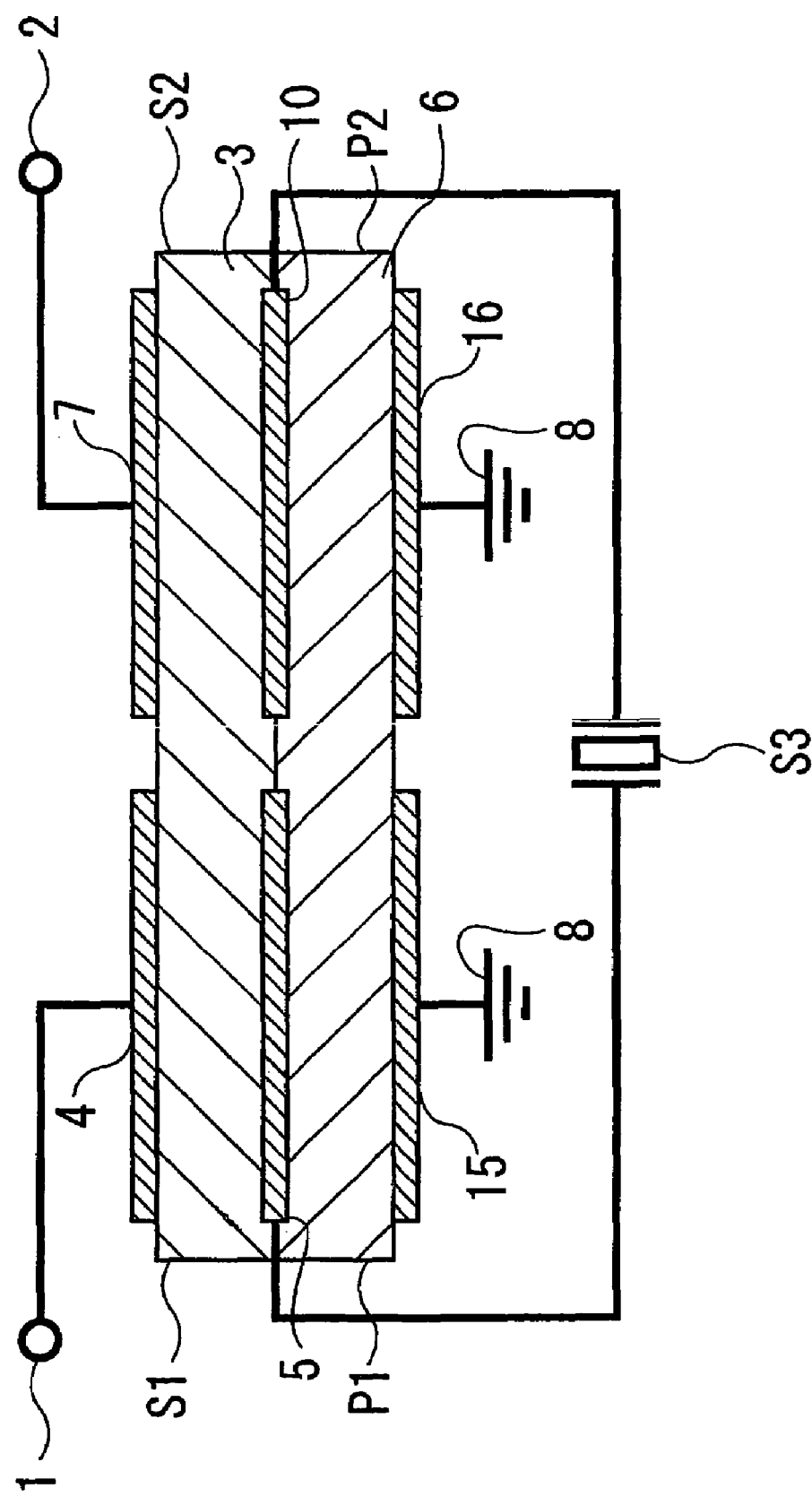
FIG. 29 is a diagram schematically showing still another example of the configurations of the filter device according to the third embodiment of the present invention.
Figure 30:
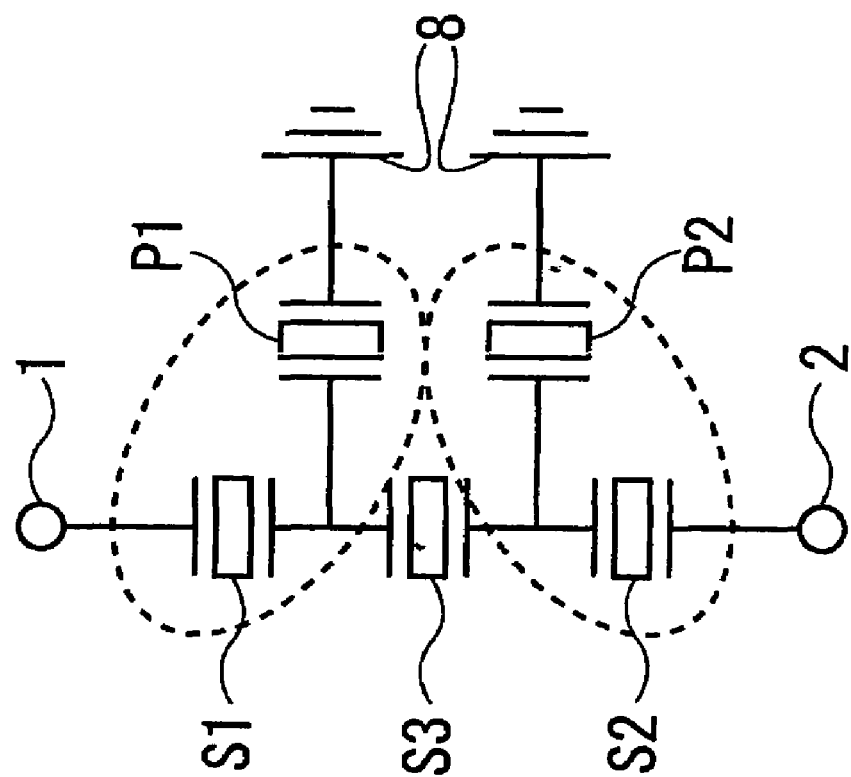
FIG. 30 is a diagram showing an equivalent circuit of the filter device shown in FIG. 29.

FIG. 20 is a diagram schematically showing one example of configurations of a filter device of a third embodiment of the present invention. FIG. 21 is a diagram showing an equivalent circuit of the filter device shown in FIG. 20. FIG. 22 is a graph showing a frequency characteristic of the filter device shown in FIG. 20. FIG. 23 is a diagram schematically showing another example of configurations of the filter device of the third embodiment. FIG. 24 is a diagram showing an equivalent circuit of the filter device shown in FIG. 23. FIG. 25 is a diagram schematically showing still another example of configurations of the filter device of the third embodiment. FIG. 26 is a diagram showing an equivalent circuit of the filter device shown in FIG. 25. FIG. 27 is a diagram schematically showing still another example of the configurations of the filter device of the third embodiment. FIG. 28 is a diagram showing an equivalent circuit of the filter device shown in FIG. 27. FIG. 29 is a diagram schematically showing still another example of configurations of the filter device of the third embodiment. FIG. 30 is a diagram showing an equivalent circuit of the filter device shown in FIG. 29.

As shown in FIG. 20, in the filter device of the third embodiment, between an input signal electrode 1 and an output signal electrode 2 is connected a signal-side resonator S and between the output signal electrode 2 and a ground electrode 8 is connected a ground-side resonator P.

That is, the signal-side resonator S is made up of a first piezoelectric film 3, an input electrode film 4 connected to the input signal electrode 1, and an output electrode film 7 being connected to the output signal electrode 2 and sandwiching the first piezoelectric film 3 using the input electrode film 4. The ground-side resonator P is made up of a second piezoelectric film 6 and a ground electrode film 17 connected to the ground electrode 8 and sandwiching the second piezoelectric film 6 using the output electrode film 7, and is acoustically coupled to the signal-side resonator S.

The signal-side resonator S operates in a specified resonant frequency Fr1 and in a specified anti-resonant frequency Fa1 and the ground-side resonator P operates in a specified resonant frequency Fr2 and in an anti-resonant frequency Fa2 almost conforming to the resonant frequency in which the signal-side resonator S operates.

FIG. 21 is a diagram showing an equivalent circuit of the filter device having the configurations described above and FIG. 22 shows a frequency characteristic of the filter device. The filter device of the third embodiment as shown in FIG. 21 has also electrically same configurations as the conventional ladder-type filter device. Therefore, as shown in FIG. 22, the filter device of the third embodiment has, as in the case of the conventional ladder-type filter device, a frequency characteristic that allows the filter device to operate in a wide frequency band.

In the filter device having the configurations described above, an area occupied by the resonator can be reduced more compared with the case of the conventional ladder-type filter device in which components are arranged so as to be able to avoid interference, which enables the filter device to be small in size, and by employing the layer-stacked structure, connecting paths being electrically connected to one another are shortened, which enables the filter device to be low in power loss. Furthermore, the filter device of the third embodiment can have a wide frequency band characteristic being equal to that of the conventional ladder-type filter device.

Therefore, the filter device of the third embodiment, also being low in power loss and small in size, and being able to operate in a wide frequency band can be obtained.

Still another example of configurations of the filter device of the third embodiment is shown in FIG. 23 and a diagram showing an equivalent circuit of the filter device is shown in FIG. 24.

In the filter device shown in FIG. 23, between an input signal electrode 1 and an output signal electrode 2 is connected a signal-side resonator S and between the input signal electrode 1 and a ground electrode 8 is connected a ground-side resonator P.

The ground-side resonator P is made up of a first piezoelectric film 3, an input electrode film 4 connected to the input signal electrode 1, and a ground electrode film 17 being connected to the ground electrode 8 and sandwiching the first piezoelectric film 3 using the input electrode film 4. The signal-side resonator S is made up of a second piezoelectric film 6, the input electrode film 4, and an output electrode film 7 being connected to the output signal electrode 2 and sandwiching the second piezoelectric film 6 using the input electrode film 4, and being acoustically coupled to the ground-side resonator P.

The signal-side resonator S operates in a specified resonant frequency Fr1 and in a specified anti-resonant frequency Fa1 and the ground-side resonator P operates in a specified resonant frequency Fr2 and in an anti-resonant frequency Fa2 almost conforming to the resonant frequency in which the signal-side resonator S operates.

Thus, according to the filter device having the configurations described above, the filter device can be realized which also is low in power loss and small in size, and can operate in a wide frequency band.

Still another example of the configurations of the filter device of the third embodiment is shown in FIG. 25 and a diagram showing an equivalent circuit of the filter device is shown in FIG. 26.

As shown in FIG. 25, between an input signal electrode 1 and an output signal electrode 2 is connected a signal-side resonator S and between the output signal electrode 2 and a ground electrode 8 is connected a first ground-side resonator P1, and between the input signal electrode 1 and a ground electrode 8 is connected a second ground-side resonator P2.

The signal-side resonator S is made up of a first piezoelectric film 3, an input electrode film 4 connected to the input signal electrode 1, and an output electrode film 7 being connected to the output signal electrode 2 and sandwiching the first piezoelectric film 3 using the input electrode film 4, and operates in a specified resonant frequency Fr1 and in a specified anti-resonant frequency Fa1.

The first ground-side resonator P1 is made up of a second piezoelectric film 6, a first ground electrode film 15 being connected to the ground electrode 8 and sandwiching the second piezoelectric film 6 using the output electrode film 7, and operates in a specified resonant frequency Fr3 and in an anti-resonant frequency Fa3 almost conforming to the resonant frequency in which the signal-side resonator S operates and being acoustically coupled to the signal-side resonator S. Also, the second ground-side resonator P2 is made up of a third piezoelectric film 9 formed on the first piezoelectric film 3 in a layer-stacking direction, and a ground electrode film 16 being connected to the ground electrode 8 and sandwiching the third piezoelectric film 9 using the input electrode film 4, and operates in a resonant frequency Fr3 and in an anti-resonant frequency almost conforming to the resonant frequency Fr1 in which the signal-side resonator S operates and is acoustically coupled to the signal-side resonator S.

In the filter device having the configurations described above, the number of stacked layers is 3 and, therefore, the filter device is achieved which is low in power loss and smaller in size and can operate in a wide frequency band.

Still another example of configurations of the filter device of the third embodiment is shown in FIG. 27 and a diagram showing an equivalent circuit of the filter device is shown in FIG. 28.

The filter device shown in FIG. 27 is one achieved by substantially connecting the filter device shown in FIG. 20 in a two-stage state. A first signal-side resonator S1 is made up of a first piezoelectric film 3, an input electrode film 4, and a common electrode film 5 being commonly used by a first ground-side resonator P1 and sandwiching the first piezoelectric film 3 using the input electrode film 4. A second signal-side resonator S2 is made up of the first piezoelectric film 3, an output electrode film 7, and a common electrode film 10 being commonly used by the second signal-side resonator S2 and sandwiching the first piezoelectric film 3 using the output electrode film 7.

The first ground-side resonator P1 is made up of a second piezoelectric film 6, the common electrode film 5, and a first ground electrode film 15 being connected to the ground electrode 8 and sandwiching the second piezoelectric film 6 using the common electrode film 5, and is acoustically coupled to the first signal-side resonator S1. A second ground-side resonator P2 is made up of the second piezoelectric film 6, the common electrode film 10, and a second ground electrode film 16 being connected to the ground electrode 8 and sandwiching the second piezoelectric film 6 using the common electrode film 10, and is acoustically coupled to the second signal-side resonator S2. The first ground electrode film 15 and the second ground electrode film 16 may be integrally formed.

According to the configurations of the filter device as above, by using an area corresponding to about two pieces of resonators, the same characteristic as obtained by two-dimensionally arranged four pieces of resonators can be realized, which enables the filter device to be small in size, and by employing the layer-stacked structure, connecting paths being electrically connected to one another can be shortened, which enables the filter device to be low in power loss. Also, the filter device of the third embodiment can provide a wide frequency band characteristic being equal to that of the conventional ladder-type filter device. Thus, the filter device is achieved which is made low in power loss and small in size, and can operate in a wide frequency band.

As shown in FIGS. 29 and 30, the same effect as above can be obtained by forming one piece of the third signal-side resonator S3 or two or more pieces of the third signal-side resonators S3 between the common electrode films 5 and 10.

Fourth Embodiment

Figure 31:
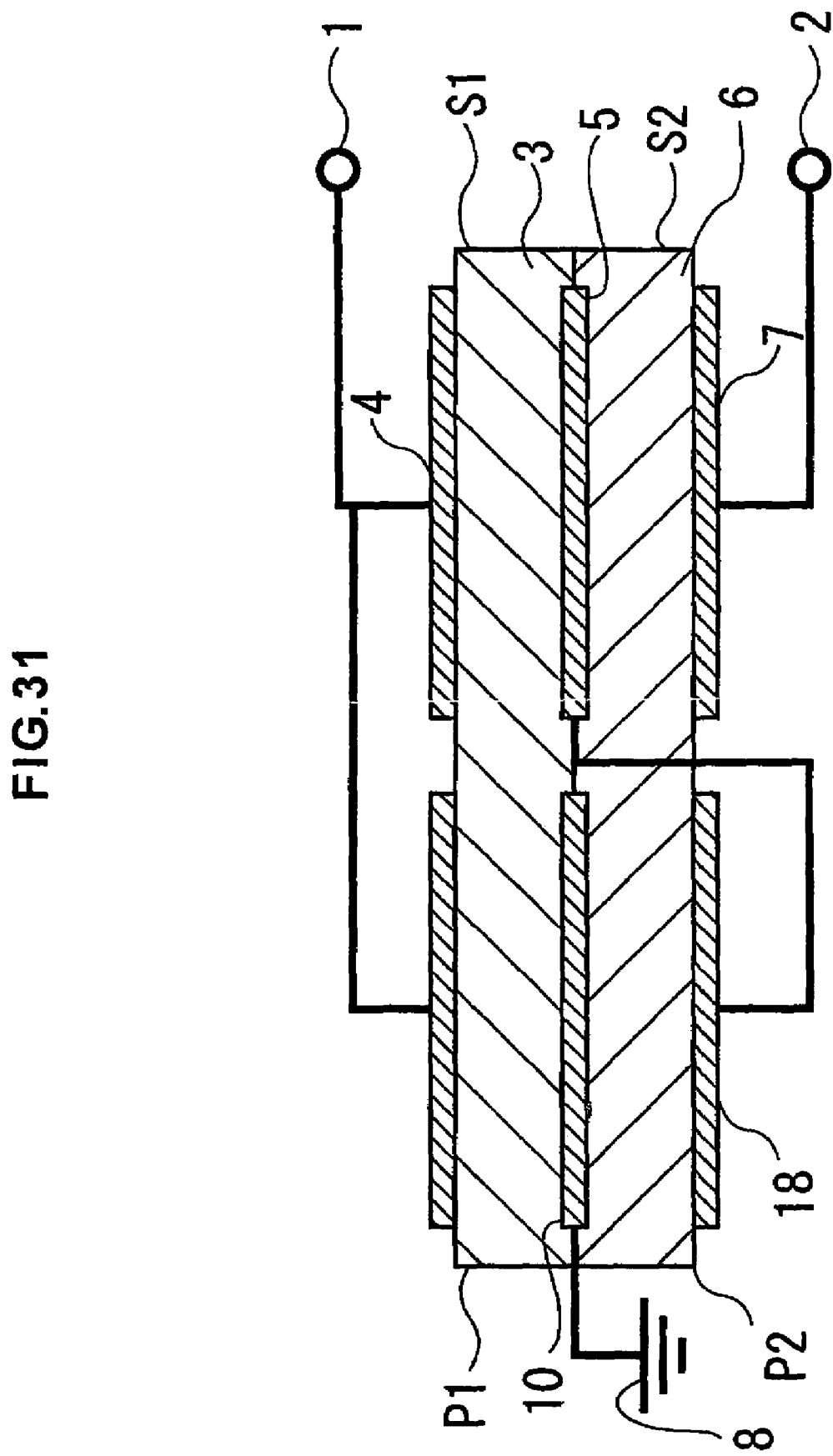
FIG. 31 is a diagram schematically showing one example of configurations of a filter device according to a fourth embodiment of the present invention.
Figure 32:
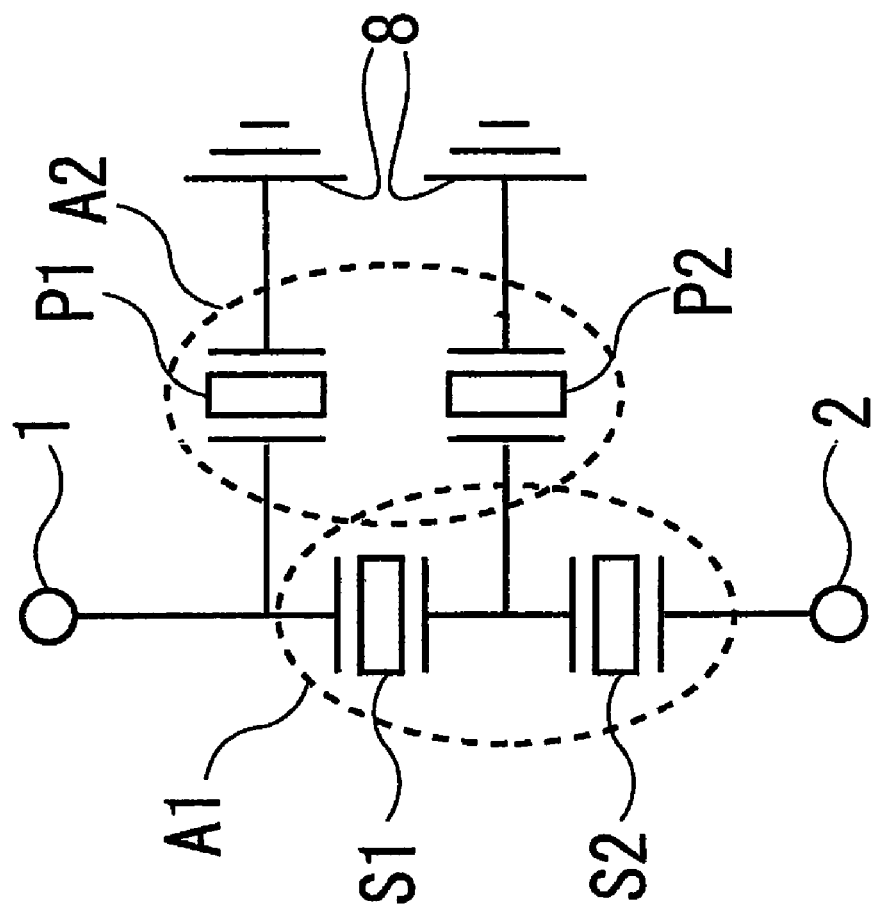
FIG. 32 is a diagram showing an equivalent circuit of the filter device shown in FIG. 31.

FIG. 31 is a diagram schematically showing one example of configurations of a filter device of a fourth embodiment of the present invention. FIG. 32 is a diagram schematically showing an equivalent circuit of the filter device shown in FIG. 31.

The filter device of the fourth embodiment is achieved by combining the filter device shown in FIG. 1 with the filter device shown in FIG. 11. In FIG. 32, a portion shown by A1 corresponds to the filter device shown in FIG. 1 and a portion shown by A2 corresponds to the filter device shown in FIG. 11.

Between an input signal electrode 1 and an output signal electrode 2 are connected a first signal-side resonator S1 and a second signal-side resonator S2 and between the input signal electrode 1 and a ground electrode 8 is connected a first ground-side resonator P1, and between a central point between the first signal-side resonator S1 and second signal-side resonator S2 and the ground electrode 8 is connected a second ground-side resonator P2.

As shown in FIG. 31, the first signal-side resonator S1 is made up of a first piezoelectric film 3, an input electrode film 4, and a common electrode film 5 being commonly used by the second signal-side resonator S2 and sandwiching the first piezoelectric film 3 using the input electrode film 4. The second signal-side resonator S2 is made up of a second piezoelectric film 6, and the common electrode film 5 sandwiching the second piezoelectric film 6 using an output electrode film 7, and is acoustically coupled to the first signal-side resonator S1.

The first ground-side resonator P1 is made up of the piezoelectric film 3, the input electrode film 4, and a common electrode film 10 being commonly used by the second ground-side resonator P2 and sandwiching the first piezoelectric film 3 using the input electrode film 4 and being connected to the ground electrode 8. The second ground-side resonator P2 is made up of the second piezoelectric film 6, an intermediate electrode film 18 connected to the common electrode film 5 of the signal-side resonators S1 and S2, and the common electrode film 10 sandwiching the second piezoelectric film 6 using the intermediate electrode film 18 and being connected to the ground electrode 8, and is acoustically coupled to the first ground-side resonator P1.

A piezoelectric film may be stacked in layer between the first piezoelectric film 3 and second piezoelectric film 6, with a common electrode film being interposed.

According to the configurations of the filter device as above, by using an area corresponding to about two pieces of resonators, the same characteristic as obtained by two-dimensionally arranged four pieces of resonators can be realized, which enables the filter device to be small in size, and by employing the layer-stacked structure, connecting paths being electrically connected to one another can be shortened, which enables the filter device to be low in power loss. Also, the filter device of the fourth embodiment can provide a wide frequency band characteristic being equal to that of the conventional ladder-type filter device. Thus, the filter device is achieved which is made low in power loss and small in size, and can operate in a wide frequency band.

Fifth Embodiment

Figure 33:
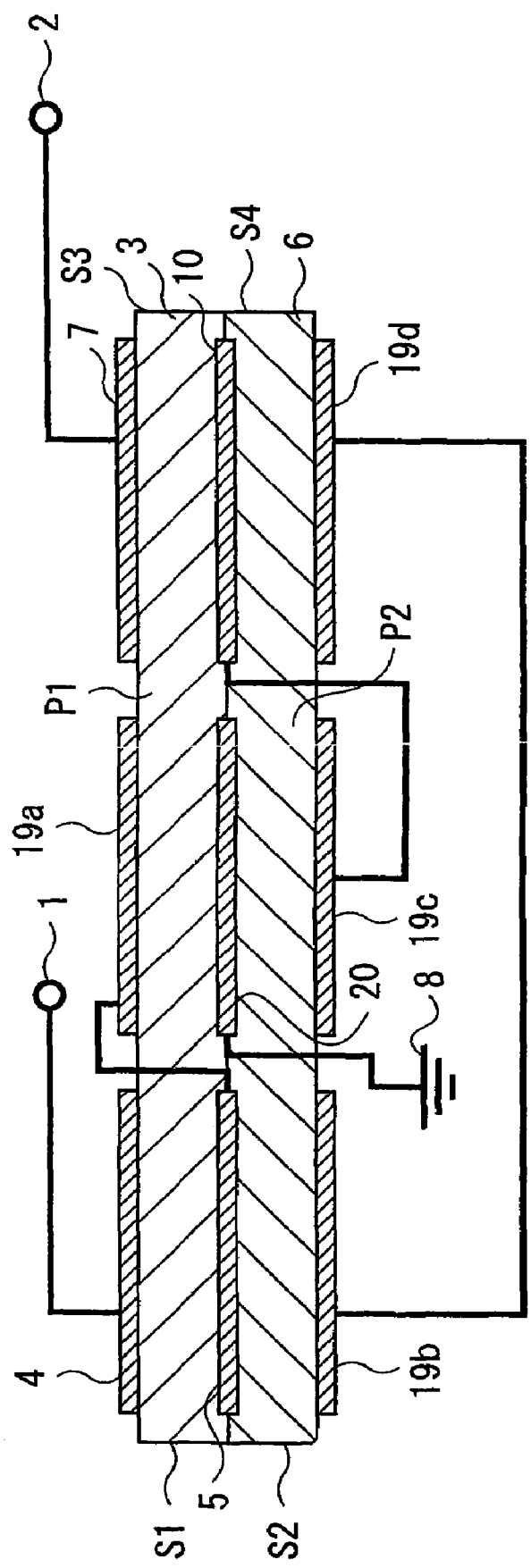
FIG. 33 is a diagram schematically showing one example of configurations of a filter device according to a fifth embodiment of the present invention.
Figure 34:
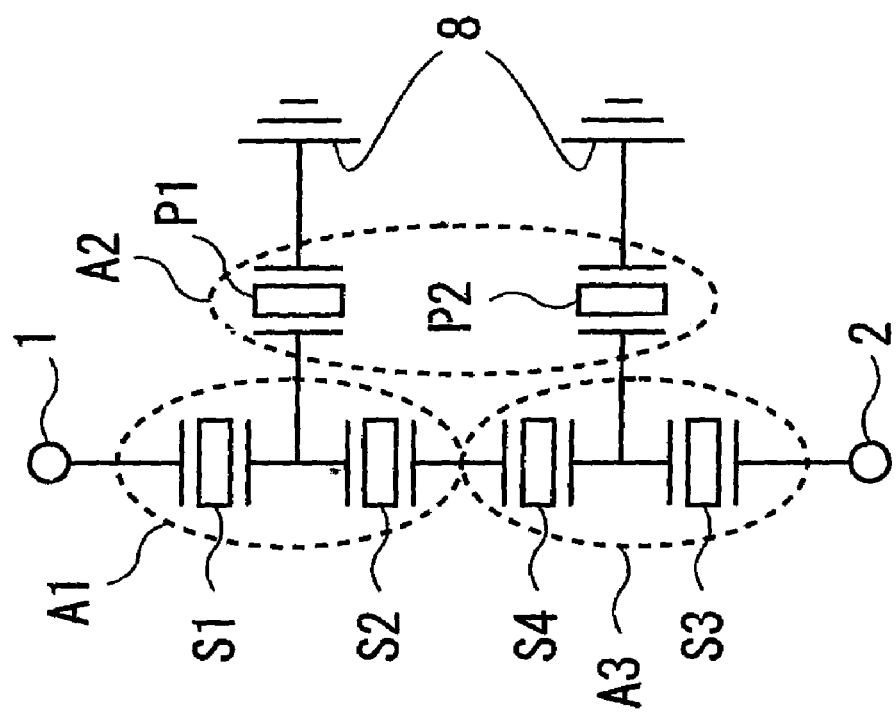
FIG. 34 is a diagram showing an equivalent circuit of the filter device shown in FIG. 33.

FIG. 33 is a diagram schematically showing one example of configurations of a filter device of a fifth embodiment of the present invention. FIG. 34 is a diagram showing an equivalent circuit of the filter device shown in FIG. 33.

Figure 35:
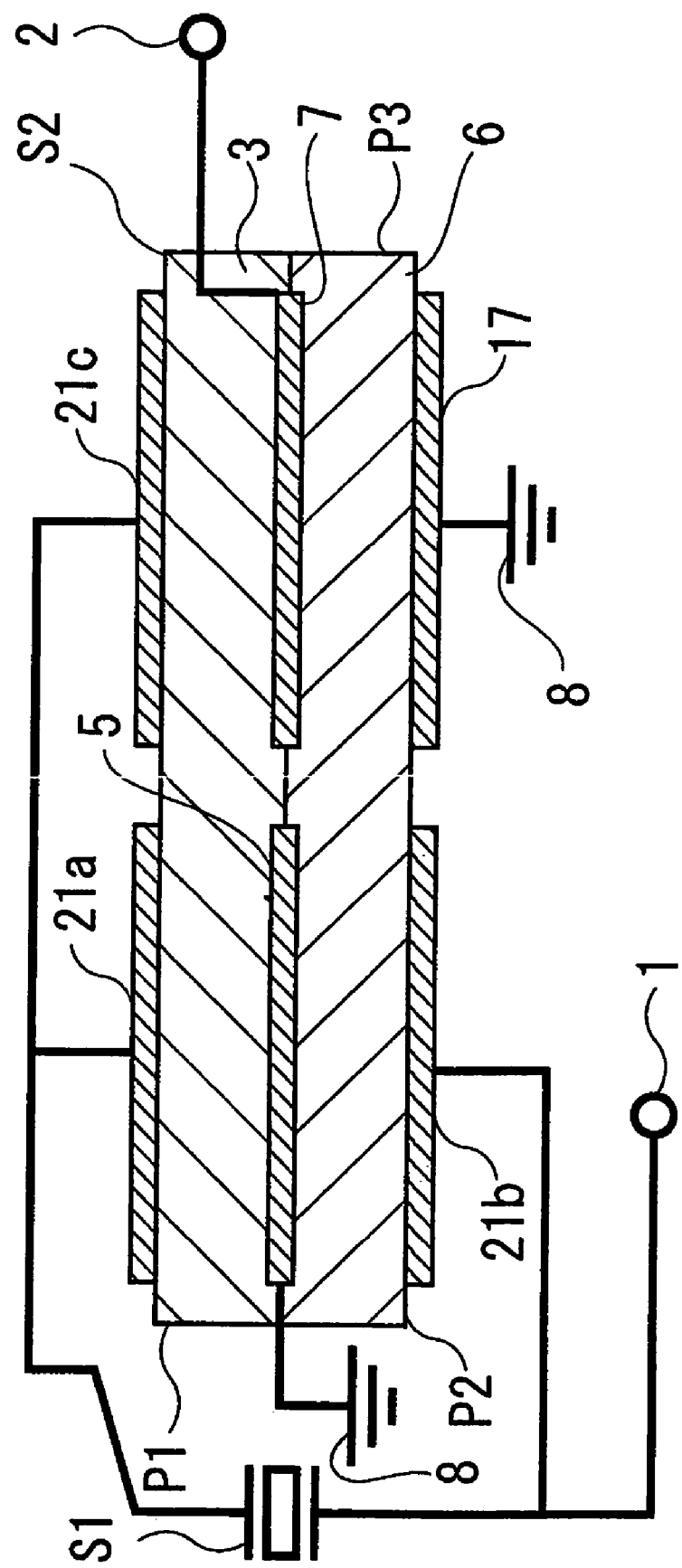
FIG. 35 is a diagram schematically showing one example of configurations of a filter device according to a sixth embodiment of the present invention.

The filter device of the fifth embodiment is achieved by combining two filter devices shown in FIG. 1 with the filter device shown in FIG. 11. In FIG. 35, a portion shown by A1 and A3 corresponds to the filter device shown in FIG. 1 and a portion shown by A2 corresponds to the filter device shown in FIG. 11.

Between a first signal electrode 1 and an output signal electrode 2 are connected first to fourth signal-side resonators S1 to S4 and between a central point between the first signal-side resonators S1 and S2 and a ground electrode 8 is formed a first ground-side resonator P1, and between a central point between a third signal-side resonator S3 and a fourth signal-side resonator S4 and the ground electrode 8 is formed a second ground-side resonator P2.

As shown in FIG. 33, the first signal-side resonator S1 is made up of a first piezoelectric film 3, an input electrode film 4, and a common electrode film 5 being commonly used by the second signal-side resonator S2 and sandwiching the first piezoelectric layer 3 using the input electrode film 4. The second signal-side resonator S2 is made up of a second piezoelectric film 6, an intermediate electrode film 19b connected to an intermediate electrode film 19a, and the common electrode film 5 sandwiching the second piezoelectric film 6 using the intermediate electrode 19b, and is acoustically coupled to the first signal-side resonator S1.

Also, the third signal-side resonator S3 is made up of the first piezoelectric film 3, an output electrode film 7, and a common electrode film 10 being commonly used by the fourth signal-side resonator S4 and sandwiching the first piezoelectric film 3 using the output electrode film 7. The fourth signal-side resonator S4 is made up of the second piezoelectric film 6, an intermediate electrode film 19d connected to the intermediate electrode film 19b, and a common electrode film 10 sandwiching the second piezoelectric film 6 using the intermediate electrode film 19d, and is acoustically coupled to the third signal-side resonator S3.

The first ground-side resonator P1 is made up of the first piezoelectric film 3, the intermediate electrode film 19a connected to the common electrode film 5, and a common electrode film 20 being commonly used by the second ground-side resonator P2 and sandwiching the first piezoelectric film 3 using the intermediate electrode film 19a. The second ground-side resonator P2 is made up of the second piezoelectric film 6, an intermediate electrode film 19c connected to the common electrode film 10, and the common electrode film 20 sandwiching the second piezoelectric film 6 using the intermediate electrode film 19c, and is acoustically coupled to the first ground-side resonator P1.

According to the configuration of the filter device as above, by using an area corresponding to about three pieces of resonators, the same characteristic as obtained by two-dimensionally arranged six pieces of resonators can be realized, which enables the filter device to be small in size, and by employing the layer-stacked structure connecting paths being electrically connected to one another can be shortened, which enables the filter device to be low in power loss. Also, the filter device of the fifth embodiment can provide a wide frequency band characteristic being equal to that of the conventional ladder-type filter device. Thus, the filter device is achieved which is made low in power loss and small in size, and can operate in a wide frequency band.

Sixth Embodiment

Figure 36:
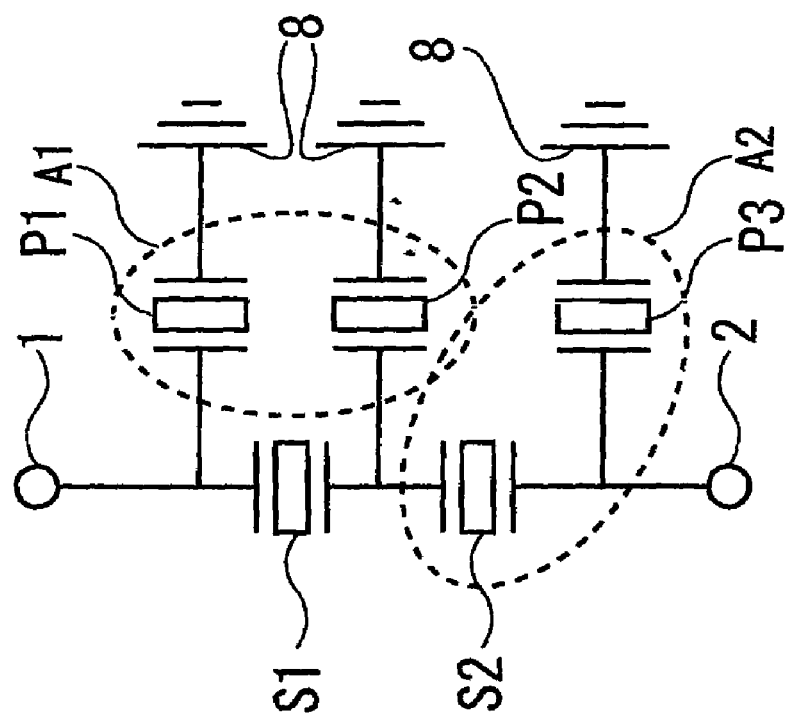
FIG. 36 is a diagram showing an equivalent circuit of the filter device shown in FIG. 35.

FIG. 35 is a diagram schematically showing one example of configurations of a filter device of a sixth embodiment of the present invention. FIG. 36 is a diagram showing an equivalent circuit of the filter device shown in FIG. 35.

The filter device of the sixth embodiment is achieved by combining the filter device shown in FIG. 11 with that shown in FIG. 20. In FIG. 36, a portion shown by A1 corresponds to the filter device shown in FIG. 11 and a portion shown by A2 corresponds to the filter device shown in FIG. 20.

As shown in FIG. 35, between an input signal electrode 1 and an output signal electrode 2 are connected a first signal-side resonator S1 and a second signal-side resonator S2 and between the input signal electrode 1 and a ground electrode 8 is formed a first ground-side resonator P1 and between a central point between the first signal-side resonators S1 and S2 and the ground electrode 8 is formed a second ground-side resonator P2, and between the output signal electrode 2 and the ground electrode 8 is formed a third ground-side resonator P3.

That is, the first ground-side resonator P1 is made up of a first piezoelectric film 3, a first ground-side input electrode film 21a connected (in FIG. 35, connected via the first signal-side resonator S1) to the input signal electrode 1, and a common electrode film 5 being commonly used by the second ground-side resonator P2 and sandwiching the first piezoelectric film 3 using the first ground-side input electrode 21a and being connected to the ground electrode 8. The second ground-side resonator P2 is made up of a second piezoelectric film 6, a second ground-side input electrode film 21b connected to the input signal electrode 1, and the common electrode film sandwiching the second piezoelectric film 6 using the second ground-side input electrode film 21b and being connected to the ground electrode 8, and is acoustically coupled to the first ground-side resonator P1.

The second signal-side resonator S2 is made up of the first piezoelectric film 3, a signal-side input electrode film 21c connected (in FIG. 35, connected via the first signal-side resonator S1) to the input signal electrode 1 and an output electrode film 7 being connected to the output signal electrode 2 and sandwiching the first piezoelectric film 3 using the signal-side input electrode film 21c.

The third ground-side resonator P3 is made up of the second piezoelectric film 6 and a ground electrode film 17 being connected to the ground electrode 8 and sandwiching the second piezoelectric film 6 using the output electrode film 7, and is acoustically coupled to the second signal-side resonator S2.

According to the configurations of the filter device as above, by using an area corresponding to about three pieces of resonators, the same characteristic as obtained by two-dimensionally arranged five pieces of resonators can be realized, which enables the filter device to be small in size, and by employing the layer-stacked structure, connecting paths being electrically connected to one another can be shortened, which enables the filter device to be low in power loss. Also, the filter device of the sixth embodiment can provide a wide frequency band characteristic being equal to that of the conventional ladder-type filter device. Thus, the filter device is achieved which is made low in power loss and small in size, and can operate in a wide frequency band.

Seventh Embodiment

Figure 37:
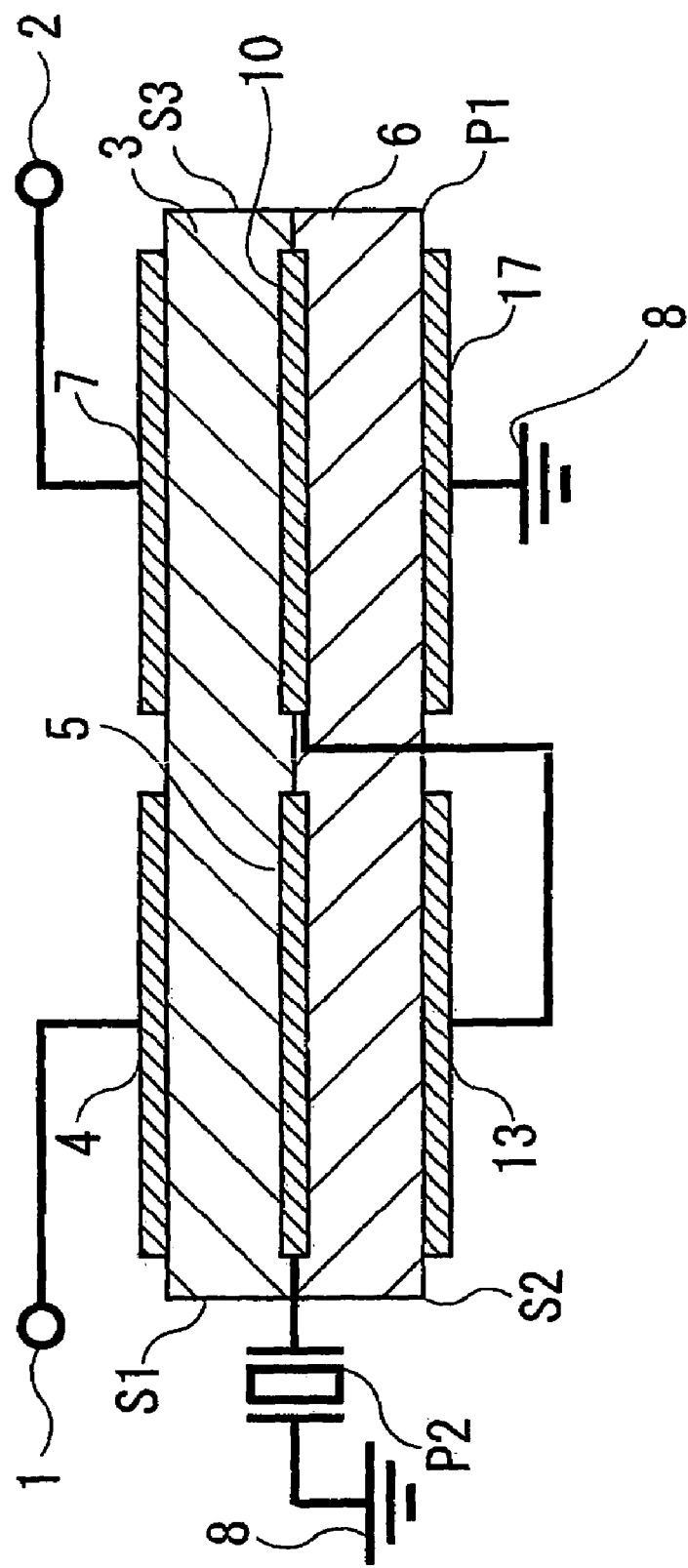
FIG. 37 is a diagram schematically showing one example of configurations of a filter device according to a seventh embodiment of the present invention.
Figure 38:
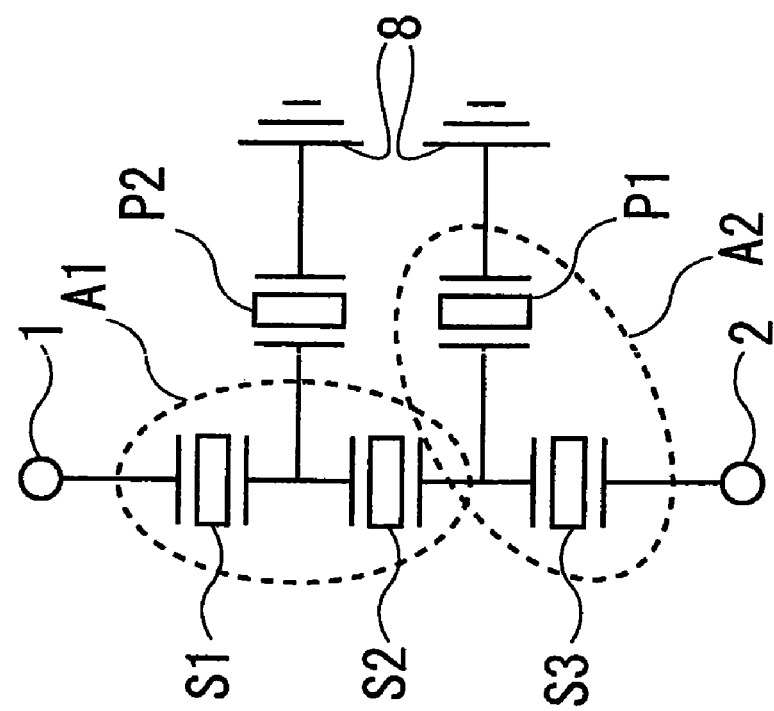
FIG. 38 is a diagram showing an equivalent circuit of the filter device shown FIG. 37.

FIG. 37 is a diagram schematically showing one example of configurations of a filter device according to a seventh embodiment of the present invention. FIG. 38 is a diagram showing an equivalent circuit of the filter device shown in FIG. 37.

The filter device of the seventh embodiment is achieved by combining the filter device shown in FIG. 11 with that shown in FIG. 20. In FIG. 38, a portion shown by A1 corresponds to the filter device shown in FIG. 11 and a portion shown by A2 corresponds to the filter device shown in FIG. 20.

As shown in FIG. 37, between au input signal electrode 1 and an output signal electrode 2 are connected first to third signal-side resonators S1 to S3 and between a central point between the first signal-side resonators S1 and S2 and a ground electrode 8 is formed a second ground-side resonator P2, and between a central point between the second signal-side resonator S2 and a third signal-side resonator S3 and the ground electrode 8 is formed a first ground-side resonator P1.

That is, the first signal-side resonator S1 is made up of a first piezoelectric film 3, an input electrode film 4, and a common electrode film 5 being commonly used by the second signal-side resonator S2 and sandwiching the first piezoelectric film 3 using the input electrode film 4. The second signal-side resonator S2 is made up of a second piezoelectric film 6, an intermediate electrode film 13 connected to a common electrode film 10, and a common electrode film 5 sandwiching the second piezoelectric film 6 using the intermediate electrode film 13, and is acoustically coupled to the first signal-side resonator S1. The third signal-side resonator S3 is made up of the first piezoelectric film 3, an output electrode film 7, and a common electrode film 10 being connected to the intermediate electrode film 13 and sandwiching the first piezoelectric film 3 using the output electrode film 7.

The first ground-side resonator P1 is made up of the second piezoelectric film 6 and a ground electrode film 17 being connected to the ground electrode 8 and sandwiching the second piezoelectric film 6 using the common electrode film 10, and is acoustically coupled to the third signal-side resonator S3.

According to the configurations of the filter device as above, by using an area corresponding to about three pieces of resonators, the same characteristic as obtained by two-dimensionally arranged five pieces of resonators can be realized, which enables the filter device to be small in size, and by employing the layer-stacked structure, connecting paths being electrically connected to one another can be shortened, which enables the filter device to be low in power loss. Also, the filter device of the sixth embodiment can provide a wide frequency band characteristic being equal to that of the conventional ladder-type filter device. Thus, the filter device is achieved which is made low in power loss and small in size, and can operate in a wide frequency band.

In the above embodiments, the filter having a two layer-structure or three layer-structure is shown, however, it is needless to say that a four or more layer-structure may be employed.

That is, signal-side resonators described above can operate in resonant frequencies approximately conforming to one another and can have a layer-structure being acoustically coupled to one another. In such a case, the ground-side resonator is connected to at least one of common electrode films being commonly used by signal-side resonators or at least one of common electrode films not being commonly used by signal-side resonators.

Moreover, ground-side resonators described above can operate in resonant frequencies conforming to one another and can have layer-structures being acoustically coupled to one another. In such a case, the common electrode film being commonly used by the ground-side resonators is connected to the ground electrode.

Furthermore, in the filter device described above, a structure in which the ground-side resonator and the signal-side resonator are formed in a layer-stacking direction can be used. That is, two or more ground-side resonators can operate in anti-resonant frequencies approximately conforming to one another, and are acoustically coupled to one another and have a non-common electrode film and a common electrode film being commonly used by the two or more ground-side resonators is connected to the ground electrode. Also, two or more signal-side resonators can operate in anti-resonant frequencies approximately conforming to the anti-resonant frequency in which the ground-side resonators operate, and one non-common electrode film in the signal-side resonators is connected to the other non-common electrode film in the ground-side resonator and another non-common electrode film or the non-common electrode film being commonly used by the signal-side resonators is connected to another non-common electrode film in the ground-side resonators.

Moreover, in the filter device described above, a dielectric layer or acoustic reflecting film can be formed between common electrode films. Also, an inductor element can be connected between the common electrode film and the ground electrode or between the non-common electrode and the ground electrode. Furthermore, an inductor element can be connected to at least either of the input signal electrode or the output signal electrode.

In the filter device described above, the piezoelectric film containing the signal-side resonator is preferably formed so that its film thickness is smaller in size than that of the piezoelectric film not containing the signal-side resonator. This causes a resonant frequency of the signal-side resonator to become higher, thus enabling an excellent frequency characteristic to be obtained.

It is apparent that the present invention is not limited to the above embodiments but may be changed and modified without departing from the scope and spirit of the invention. For example, in the above embodiments, the filter device is constructed of the SMR-type piezo-resonator, however, it may be constructed of a diaphragm-type piezo-resonator.

Figure 39:
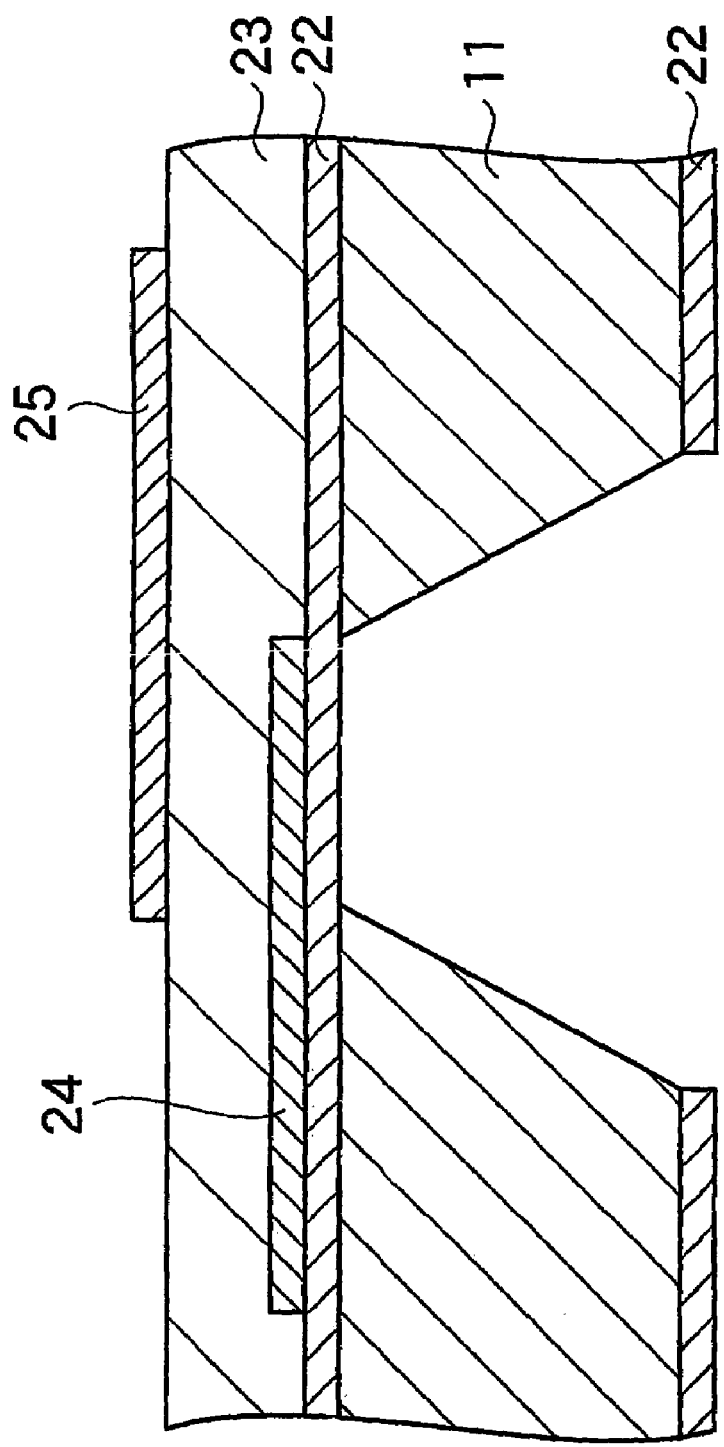
FIG. 39 is a cross-sectional view illustrating a configuration of a piezo-resonator making up another filter device of the present invention.

Here, configurations of the diaphragm-type piezo-resonator are described by referring to FIG. 39. As shown in FIG.

39, the diaphragm-type piezo-resonator is so configured that, on one side of a substrate 11 made of silicon or glass, on both sides of which protecting layers such as a $SiO_2$ film are formed, a lower electrode 24 and an upper electrode 25 are formed in layers with a piezoelectric film 23 maid of AlN or ZaO being sandwiched between the lower electrode 24 and the upper electrode 25. In a portion where the lower electrode 24 an upper electrode 25 overlap each other, in order to achieve easy propagation of a bulk wave, the substrate 11 is a partially notched by using an etching method.

The filter device constructed as above operates as a single filter device, however, the branching filter may be constructed by using two or more filter devices operating in passing hands each being different from one another.

What is claimed is:

1. A filter device comprising,
   first and second ground-side resonators operating in anti-resonant frequencies almost conforming to one another and being acoustically coupled to each other and connecting a common electrode film being commonly used by said first and second ground-side resonators to a ground electrode and having a layer-stacked structure; and
   a signal-side resonator formed between a non-common electrode film in said first ground-side resonator and a non-common electrode film in said second ground-side resonator and operating in resonant frequencies almost conforming to anti-resonant frequencies in which said first and second ground-side resonators operate.

2. The filter device according to claim 1, wherein said signal-side resonator contains a common electrode film formed on a same layer as said first ground-side resonator or said second ground-side resonator are formed.

3. The filter device according to claim 2, wherein said signal-side resonator is a piezoelectric thin-film resonator, surface acoustic wave resonator, or dielectric resonator.

4. A filter device comprising:
   an input signal electrode and an output signal electrode;
   a first signal-side resonator having a first piezoelectric film, an input electrode film connected to said input signal electrode, and a common electrode film being commonly used by another signal-side resonator and sandwiching said first piezoelectric film using said input electrode film, and operating in a specified resonant frequency and in a specified anti-resonant frequency;
   a second signal-side resonator having said first piezoelectric film, an output electrode film connected to said output signal electrode, and a common electrode film being commonly used by another signal-side resonator and sandwiching said first piezoelectric film using said output electrode film, and operating in a specified resonant frequency and in a specified anti-resonant frequency;
   a third signal-side resonator having a second piezoelectric film formed on said first piezoelectric film in a layer-stacking direction, a common electrode film being commonly used by another signal-side resonator, and an intermediate electrode film sandwiching said second, piezoelectric film using said common electrode film and operating in a specified resonant frequency and in a specified anti-resonant frequency and being acoustically coupled to said first signal-side resonator;
   a fourth signal-side resonator having said second piezoelectric film, a common electrode film being commonly used by another signal-side resonator, and an intermediate electrode film connected to the intermediate electrode film in said third signal-side resonator and sandwiching said second piezoelectric film using said common electrode film, and operating in a specified resonant frequency and in a specified and-resonant frequency and being acoustically coupled to said second signal-side resonator; and
   a ground-side resonator being formed between said common electrode film and a ground electrode and operating in a specified resonant frequency and in an anti-resonant frequency almost conforming to resonant frequencies in which said first signal-side resonator, said second signal-side resonator, said third signal-side resonator, and said fourth signal-side resonator operate.

5. A filter device comprising:
   an input signal electrode and an output signal electrode;
   a signal-side resonator being connected between said input signal electrode and said output signal electrode and operating in a specified resonant frequency and in a specified anti-resonant frequency;
   a first ground-side resonator having a first piezoelectric film, an input electrode film connected to said input signal electrode, and a common electrode film being commonly used by another ground-side resonator and sandwiching said first piezoelectric film using said input electrode film and being connected to a ground electrode, and operating in a specified resonant frequency and in an anti-resonant frequency almost conforming to a resonant frequency in which said signal-side resonator operate;
   a second ground-side resonator having a second piezoelectric film formed on said first piezoelectric film in a layer-stacking direction, an output electrode film connected to said output signal electrode, and a common electrode film being commonly used by another ground-side resonator and sandwiching said second piezoelectric film using said output electrode film and being connected to said ground electrode, and operating in a specified resonant frequency and in an anti-resonant frequency almost conforming to a resonant frequency in which said signal-side resonator operates and being acoustically coupled to said first ground-side resonator.

6. A filter device comprising:
   an input signal electrode and an output signal electrode;
   a signal-side resonator being connected between said input signal electrode and said output signal electrode and operating in a specified resonant frequency and in a specified anti-resonant frequency;
   a first ground-side resonator having a first piezoelectric film, a first ground-electrode film connected to a ground electrode, and a common electrode film being commonly used by another ground-side resonator and sandwiching the first piezoelectric film using said first ground electrode film and being formed between said input signal electrode and said output signal electrode, and operating in a specified resonant frequency and in an anti-resonant frequency almost conforming to a resonant frequency in witch said signal-side resonator operate; and
   a second ground-side resonator having a second piezoelectric film formed on the first piezoelectric film in a layer-stacking direction, a second ground electrode film connected to said ground electrode and a common electrode film being commonly used by another ground-side resonator and sandwiching said second piezoelectric film using said second ground electrode film and being formed between said input signal electrode and said output signal electrode, and operating in a specified resonant frequency and in an anti-resonant frequency almost conforming to a resonant frequency in which said signal-side resonator operates and being acoustically coupled to said first ground-side resonator.

7. A filter device comprising:
an input signal electrode and an output signal electrode;
a signal-side resonator being connected between said input signal electrode and said output signal electrode and operating in a specified resonant frequency and in a specified anti-resonant frequency;
a first ground-side resonator having a first piezoelectric film, an input electrode film connected to said input signal electrode, and a common electrode film being commonly used by another ground-side resonator and being connected to a ground electrode and sandwiching said first piezoelectric film using said input electrode film, and operating in a specified resonant frequency and in an anti-resonant frequency almost conforming to a resonant frequency in which said signal-side resonator operates,
a second ground-side resonator having said first piezoelectric film, an output electrode film being connected to said output signal electrode, and a common electrode film being commonly used by another ground-side resonator and being connected to said ground electrode and sandwiching said first piezoelectric film using said output electrode film, and operating in a specified resonant frequency and in an anti-resonant frequency almost conforming to a resonant frequency in which said signal-side resonator operates,
a third ground-side resonator having a second piezoelectric film formed on said first piezoelectric film in a layer-stacking direction, a common electrode film being commonly used by another ground-side resonator, and an intermediate electrode film sandwiching said second piezoelectric film using said common electrode film, and operating in a specified resonant frequency and in an anti-resonant frequency almost conforming to a resonant frequency in which said signal side resonator operates; and
a fourth ground-side resonator having said second piezoelectric film, a common electrode film being commonly used by another ground-side resonator, and an intermediate electrode film being connected to said intermediate electrode film in said third ground-side resonator and sandwiching said second piezoelectric film using said common electrode film, and operating in a specified resonant frequency and in an anti-resonant frequency almost conforming to a resonant frequency in which said signal-side resonator operates.

8. A filter device comprising:
an input signal electrode and an output signal electrode;
a first signal-side resonator having a first piezoelectric film, on input electrode film connected to said input signal electrode and a common electrode film being commonly used by a first ground-side resonator and sandwiching said first piezoelectric film, using said input electrode film, and operating in a specified resonant frequency and in a specified anti-resonant frequency;
a second signal resonator having a first piezoelectric film, an output electrode film connected to said output signal electrode, and a common electrode film being commonly used by a second ground-side resonator and sandwiching said first piezoelectric film using said output electrode film, and operating in a specified resonant frequency and in a specified anti-resonant frequency;
a first ground-side resonator having a second piezoelectric film formed on said first piezoelectric film in a layer-stacking direction and a first ground electrode film being connected to a ground electrode and sandwiching said second piezoelectric film using said common electrode, and operating in a specified resonant frequency and in an anti-resonant frequency almost conforming to a resonant frequency in which said signal-side resonator operates and being acoustically coupled to said first signal-side resonator, and
a second ground-side resonator having a second piezoelectric film formed on said first piezoelectric film in a layer-stacking direction and a second ground electrode film being connected to a ground electrode and sandwiching said second piezoelectric film using said common electrode film, and operating in a specified resonant frequency and in an anti-resonant frequency almost conforming to a resonant frequency in which said signal-side resonator operates and being acoustically coupled to said second signal-side resonator,
wherein at least one signal-side resonator is formed between two said common electrodes.

9. A filter device comprising:
an input signal electrode and an output signal electrode;
a first signal-side resonator having a first piezoelectric film, an input electrode film connected to said input signal electrode, and a common electrode film being commonly used by another signal-side resonator and sandwiching said first piezoelectric film using said input electrode film, and operating in a specified resonant frequency and in a specified anti-resonant frequency;
a second signal-side resonator having a second piezoelectric film formed on said first piezoelectric film in a layer-stacking direction, an output electrode film connected to said output signal electrode, and a common electrode film being commonly used by another signal-side resonator and sandwiching said second piezoelectric film using said output electrode film, and operating in a specified resonant frequency and in a specified anti-resonant frequency and being acoustically coupled to said first signal-side resonator;
a first ground-side resonator having said first piezoelectric film, an input electrode film connected to said input signal electrode and a common electrode film being commonly used by another ground-side resonator and sandwiching said first piezoelectric film using said input electrode film, and being connected to a ground electrode, and operating in a specified resonant frequency and in an anti-resonant frequency almost conforming to a resonant frequency in which said signal-side resonator operates; and
a second ground-side resonator having said second piezoelectric film, an intermediate electrode film being connected to said common electrode film in said signal-side resonator, and a common electrode film being commonly used by another ground-side resonator and sandwiching said second piezoelectric film using said intermediate electrode film and being connected to said ground electrode, and operating in a specified resonant frequency and in an anti-resonant frequency almost conforming to a resonant frequency in which said signal-side resonator and being acoustically coupled to said first ground-side resonator.

10. A filter device comprising:
an input signal electrode and an output signal electrode;
a first signal-side resonator having a first piezoelectric film, an input electrode film connected to said input signal electrode, and a common electrode film being commonly used by another signal-side resonator and sandwiching said first piezoelectric film using said input electrode film, and operating in a specified resonant frequency and in an anti-resonant frequency;
a second signal-side resonator having a second piezoelectric film formed on said first piezoelectric film in a layer-stacking direction, an intermediate electrode film connected to another intermediate electrode film, and a common electrode film being commonly used by another signal-side resonator and sandwiching said second piezoelectric film using said intermediate electrode film, and operating in a resonant frequency and in a specified anti-resonant frequency and being acoustically coupled to said first signal-side resonator,
a third signal-side resonator having said first piezoelectric film, an output electrode film connected to said output signal electrode, and a common electrode film being commonly used by another signal-side resonator and sandwiching said first piezoelectric film using said output electrode film, and operating in a specified resonant frequency and in a specified anti-resonant frequency;
a fourth signal-side resonator having said second piezoelectric film, an intermediate electrode film connected to another intermediate electrode film, and a common electrode film being commonly used by another signal-side resonator and sandwiching said second piezoelectric film using said intermediate electrode film, and operating in a specified resonant frequency and in a specified anti-resonant frequency and being acoustically coupled to said third signal-side resonator;
a first ground-side resonator having said first piezoelectric film, an intermediate electrode film connected to said common electrode film in said signal-side resonator, and a common electrode film being commonly used by another ground-side resonator and sandwiching said first piezoelectric film using said intermediate electrode film and being connected to a ground electrode, and operating in a specified resonant frequency and in an anti-resonant frequency almost conforming to a resonant frequency in which said signal-side resonator operates; and
a second ground-side resonator having said second piezoelectric film, an intermediate electrode film connected to said common electrode film in said signal-side resonator, and a common electrode film being commonly used by another ground-side resonator and sandwiching said second piezoelectric film using said intermediate electrode film and being connected to said ground electrode, and operating in a specified resonant frequency and in a specified anti-resonant frequency almost conforming to a resonant frequency in which said signal-side resonator operates and being acoustically coupled to said first ground-side resonator.

11. A filter device comprising:
an input signal electrode and an output signal electrode;
a first ground-side resonator having a first piezoelectric film, a first ground-side input electrode film connected to said input signal electrode, and a common electrode film being commonly used by another round-side resonator and sandwiching said first piezoelectric film using said first ground-side input electrode film and being connected to a ground electrode, and operating in a specified resonant frequency and in an anti-resonant frequency almost conforming to a resonant frequency in which said signal-side resonator operates;
a second ground-side resonator having a second piezoelectric film formed on said first piezoelectric film in a layer-stacking direction, a second ground-side input electrode film connected to said input signal electrode, and a common electrode film being commonly used by another ground-side resonator and sandwiching said second piezoelectric film using said second ground-side input electrode film and being connected to said ground electrode, and operating in a specified resonant frequency and in an anti-resonant frequency almost conforming to a resonant frequency in which said signal-side resonator operates and being acoustically coupled to said first ground-side resonator;
a signal-side resonator having said first piezoelectric film, and a signal-side input electrode connected to said input signal electrode, and an output electrode film being connected to said output signal electrode and sandwiching said first piezoelectric film using said signal-side input electrode film, and operating in a specified resonant frequency and in a specified anti-resonant frequency; and
a third ground-side resonator having said second piezoelectric film, a ground electrode film being connected to said ground electrode and sandwiching said second piezoelectric film using said output electrode film and operating in a specified resonant frequency and in an anti-resonant frequency almost conforming to a resonant frequency in which said signal-side resonator operates.

12. A filter device comprising:
an input signal electrode and an output signal electrode;
a first signal-side resonator having a first piezoelectric film, an input electrode film connected to said input signal electrode, and a common electrode film being commonly used by another signal-side resonator and sandwiching said first piezoelectric film using said input electrode film, and operating in a specified resonant frequency and in a specified anti-resonant frequency;
a second signal-side resonator having a second piezoelectric film formed on said first piezoelectric film in a layer-stacking direction, an intermediate electrode film connected to another common electrode film, and a common electrode film being commonly used by another signal-side resonator and sandwiching said second piezoelectric film using said intermediate electrode film, and operating in a specified resonant frequency and in a specified anti-resonant frequency and being acoustically coupled to said first signal-side resonator;
a third signal-side resonator having said first piezoelectric film, an output electrode film connected to said output signal electrode, a common electrode film being connected to said intermediate electrode film and sandwiching said first piezoelectric film using said output electrode film, and operating in a specified resonant frequency and in a specified anti-resonant frequency; and
a ground-side resonator having said second piezoelectric film, a ground electrode film being connected to a ground electrode and sandwiching said second piezoelectric film using said common electrode film in said third signal-side resonator and operating in a specified resonant frequency and in an anti-resonant frequency almost conforming to a resonant frequency in which said signal-side resonator operates and being acoustically coupled to said third signal-side resonator.

13. A filter device comprising:

two or more ground-side resonators operating in and-resonant frequencies almost conforming to one another and being acoustically coupled to one anther and having a non-common electrode film and connecting a common electrode film being commonly used by said two or more ground-side resonators to a ground electrode and having a layer-stacked structure; and two or more signal-side resonators operating in resonant frequencies almost conforming to an anti-resonant frequency in which said ground-side resonators operate and being acoustically coupled to one another and wherein one non-common electrode film is connected to one non-common electrode in said ground-side resonator and another non-common electrode or the common electrode being commonly used by said two or more signal-side resonators is connected to another non-common electrode film in said ground-side resonator and being stacked in layers together with said ground-side resonators.

* * * * *